US010725070B2

(12) United States Patent
Pupalaikis et al.

(10) Patent No.: US 10,725,070 B2
(45) Date of Patent: Jul. 28, 2020

(54) VARIABLE RESOLUTION OSCILLOSCOPE

(71) Applicant: Teledyne LeCroy, Inc., Thousand Oaks, CA (US)

(72) Inventors: Peter J. Pupalaikis, Ramsey, NJ (US); David C. Graef, Campbell Hall, NY (US); Roger Delbue, Monroe, NY (US); Kaviyesh B. Doshi, Emerson, NJ (US); Robert Mart, Pearl River, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 0 days.

(21) Appl. No.: 16/688,054

(22) Filed: Nov. 19, 2019

(65) Prior Publication Data

US 2020/0088766 A1    Mar. 19, 2020

Related U.S. Application Data

(63) Continuation of application No. 15/682,005, filed on Aug. 21, 2017, now Pat. No. 10,534,019.

(60) Provisional application No. 62/381,217, filed on Aug. 30, 2016.

(51) Int. Cl.
| | | |
|---|---|---|
| *G01R 13/34* | (2006.01) | |
| *G01R 13/20* | (2006.01) | |
| *G01R 13/02* | (2006.01) | |

(52) U.S. Cl.
CPC ......... *G01R 13/345* (2013.01); *G01R 13/029* (2013.01); *G01R 13/0272* (2013.01); *G01R 13/208* (2013.01)

(58) Field of Classification Search
CPC .................................................. G01R 13/345; G01R 13/0272; G01R 13/029; G01R 13/208
See application file for complete search history.

(56) References Cited

U.S. PATENT DOCUMENTS

| | | | | |
|---|---|---|---|---|
| 2006/0080065 A1* | 4/2006 | Pupalaikis | ......... | G01R 13/0272 702/189 |
| 2007/0273567 A1* | 11/2007 | LaMarche | .......... | G01R 13/0272 341/144 |
| 2009/0002213 A1* | 1/2009 | LaMarche | .............. | G01R 23/16 341/155 |
| 2011/0095927 A1* | 4/2011 | Pagnanelli | ............ | H03M 3/468 341/166 |
| 2012/0127009 A1* | 5/2012 | Pagnanelli | ............ | H03M 3/468 341/143 |
| 2012/0310601 A1* | 12/2012 | Martin | ............... | H03H 17/0621 702/190 |
| 2013/0016798 A1* | 1/2013 | Velazquez | .............. | H04B 1/001 375/340 |
| 2015/0091745 A1* | 4/2015 | Pagnanelli | ............ | H03M 3/468 341/143 |

(Continued)

OTHER PUBLICATIONS

Nyquist, H "Certain Topics in Telegraph Transmission Theory", Reprinted from Transactions of the *A.I.E.E.*, pp. 617-644, Feb. 1928, (Feb. 1928).

(Continued)

*Primary Examiner* — Raymond L Nimox
(74) *Attorney, Agent, or Firm* — Andrew Dommer

(57) ABSTRACT

A method and apparatus for providing variable analog to digital converter (ADC) resolution is described.

18 Claims, 14 Drawing Sheets

(56) References Cited

U.S. PATENT DOCUMENTS

2016/0072520 A1*  3/2016  Pagnanelli .............. G06F 17/10
                                                    341/143
2016/0373125 A1* 12/2016  Pagnanelli ............ H03M 3/468

OTHER PUBLICATIONS

Orwiler, Bob, "Oscilloscope Vertical Amplifiers", *Circuit Concepts, Tektronix 1 ed*, (1960),21-38.

McTigue, Michael T., et al., "An 8-Gigasample-per-Second, 8-Bit Data Acquisition System for a Sampling Digital Oscilloscope", Oct. 1993 *Hewlett-Packard Journal Hewlett-Packard Co.*, (Oct. 1993),11-23.

Pupalaikis, Peter J., "The Relationship Between Discrete-Frequency S-parameters and Continuous-Frequency Responses", *DesignCon 2012*, (Feb. 2012),1-25.

Graham, Ronald L., et al., "Concrete Mathematics: A Foundation for Computer Science, Second Edition", Chapter 4, 102-152, Mar. 10, 1994.

* cited by examiner

| stages | $\frac{1}{2\cdot\pi} \cdot \int_0^{2\cdot\pi} \cos^{2\cdot S}\left(\frac{\omega}{2}\right) \cdot d\omega$ | bits improvement | bandwidth (fraction of Nyquist rate) |
|---|---|---|---|
| 1 | $\frac{1}{2}$ | 0.5 | 0.5 |
| 2 | $\frac{3}{8}$ | 0.708 | 0.364 |
| 3 | $\frac{5}{16}$ | 0.839 | 0.3 |
| 4 | $\frac{35}{128}$ | 0.935 | 0.261 |
| 5 | $\frac{63}{256}$ | 1.011 | 0.234 |
| 6 | $\frac{231}{1024}$ | 1.074 | 0.214 |
| 7 | $\frac{429}{2048}$ | 1.128 | 0.199 |

| stages | $\frac{1}{2\cdot\pi}\cdot\int_0^{2\cdot\pi}\cos^{2\cdot S}\left(\frac{\omega}{2}\right)\cdot d\omega$ | bits improvement | bandwidth (fraction of Nyquist rate) |
|---|---|---|---|
| 1 | $\frac{1}{2}$ | 0.5 | 0.5 |
| 4.84 | $\frac{1}{4}$ | 1 | 0.238 |
| 20.1 | $\frac{1}{8}$ | 1.5 | 0.118 |
| 81.2 | $\frac{1}{16}$ | 2 | 0.059 |
| 326 | $\frac{1}{32}$ | 2.5 | 0.029 |
| 1305 | $\frac{1}{64}$ | 3 | 0.015 |
| 5220 | $\frac{1}{128}$ | 3.5 | 0.007 |

| 29 | Priorities | |
|---|---|---|
| ▲ ▼ | channels | ∼49 |
| ▲ ▼ | comp | ∼50 |
| ▲ ▼ | hi res | ∼51 |
| ▲ ▼ | user sr | ∼52 |
| ▲ ▼ | capture time | ∼53 |
| ▲ ▼ | bits | ∼54 |
| ▲ ▼ | hw sr | ∼55 |

| Resulting Acquisition Configuration | | |
|---|---|---|
| current: | 6 | ∼56 |
| Can Do: | True | ∼57 |
| Channels: | 1 | ∼58 |
| TILV: | 1 | ∼59 |
| VILV: | 8 | ∼60 |
| Bits: | 11 | ∼61 |
| HW SR: | 2.5 GS/s | ∼62 |
| MDF: | 2 | ∼63 |
| PUF: | 4 | ∼64 |
| PDF: | 1 | ∼65 |
| User SR: | 10.0 GS/s | ∼66 |
| Compensation: | 1 | ∼67 |
| Can Compensate: | 1 | ∼68 |
| HW ML: | 4.0 MS | ∼69 |
| User ML: | 16.0 MS | ∼70 |
| Capture Time: | 100.0 ns | ∼71 |
| Capture Time Specified: | 100.0 ns | ∼72 |
| User ML Used: | 1.0 KS | ∼73 |
| HW ML Used: | 250.0S | ∼74 |

FIG. 20

VARIABLE RESOLUTION OSCILLOSCOPE

CROSS REFERENCE TO RELATED APPLICATIONS

This application is a continuation of U.S. patent application Ser. No. 15/682,005 filed Aug. 21, 2017 by Pupalaikis et. al., entitled "VARIABLE RESOLUTION OSCILLOSCOPE", which in turn claims the benefit of U.S. Provisional Application No. 62/381,217 the entire contents of which are incorporated herein by reference.

TECHNICAL FIELD

The present invention relates in general to the design of waveform digitizing instruments such as oscilloscopes, for example, to digitizers that utilize analog to digital converters (ADCs) and possibly front-end amplifiers.

BACKGROUND

The present technology relates generally to waveform digitizing instruments. More specifically, the technology relates to waveform digitizing instruments consisting of analog to digital converters (ADCs) which are used to sample and digitize an analog signal, converting the analog signal to a sequence of values whose magnitude represents the voltage of the signal and the time location in the sequence represents when the signal was sampled.

Waveform digitizing instruments such as oscilloscopes are used to acquire waveforms for analysis. Of particular interest in the acquisition of waveforms is the bandwidth of the instrument. The instrument must be capable of acquiring the desired frequency content of the incoming signal. In other words, it must have sufficient speed to acquire the signal. Generally, we speak about bandwidth as the measure of instrument speed, and as such, the speed of signals it can acquire. There are several generally accepted definitions of bandwidth. One is the frequency at which the magnitude response of the instrument is down three decibels (dB) from the zero frequency (DC) response. Another is the highest frequency that the instrument can acquire. We will use the latter definition here.

A related and important instrument characteristic is the sample rate. Theoretically speaking, the sample rate of the instrument must meet the Nyquist criteria in order to avoid a well-known effect called frequency aliasing, or simply aliasing. Frequency aliasing is problematic and it is generally desirable to avoid this effect. The Nyquist criteria specifies that in order to avoid aliasing, the sample rate must be greater than twice the highest frequency that can be acquired by the instrument. In high-end instruments where the bandwidth is very high, high sample rates are difficult to achieve and sometimes the Nyquist criteria is barely met with instruments reaching sample rates of only two and one-half to three times the bandwidth. The Nyquist criteria is an absolute minimum, and it is generally accepted that sample rates of around ten times the bandwidth increase the usability of the instrument from a measurement standpoint. This is because at these high sample rates, lines can be drawn or inferred between each of the sample points taken. In order to achieve high sample rates relative to the bandwidth, two techniques are employed.

The first technique is that of time-interleaving. Time-interleaving is a technique whereby multiple ADCs sample the same analog input signal, but each of the multiple ADCs sample the signal at different times. Usually these different times are different phases of a sample clock that is a divided version of the overall interleaved sample rate. As an example, if two ADCs sample at 5 GS/s (i.e. with a sample period of 200 ps), but the second ADC samples the waveform with a sample phase shifted by 100 ps from the first ADC, then the two acquisitions from each of the ADCs can be put back together to form a resultant 10 GS/s acquisition. This technique of time interleaving is quite expensive in power and resources.

The second technique is that of waveform interpolation as explained in P. Pupalaikis, "The relationship between discrete-frequency s-parameters and continuous-frequency responses," in DesignCon, IEC, February 2012. Waveform interpolation involves techniques to mathematically create the points in between the actually acquired waveform points. The theory behind this technique is a result of meeting the Nyquist criteria which essentially states that if the sample rate is high enough, then all sample points in the waveform can be generated mathematically from the acquired waveform. Waveform interpolation is often offered in the channel vertical control menu of modern oscilloscopes as an optional waveform processing step. Most often, the configuration of this interpolation involves the user determining an upsample factor, where the upsample factor is the factor to multiply by the hardware sample rate. As an example, a 5 GS/s oscilloscope channel sampling with 1 GHz of bandwidth (i.e. at a sample rate to bandwidth ratio of five), might be configured to interpolate with an upsample factor of two to achieve a user sample rate of 10 GS/s.

When time-interleaving is employed, the sample rate of the individual, interleaved digitizers need not meet the Nyquist criteria to avoid aliasing. Usually, for waveform interpolation to be employed usefully, the interpolation is applied to a waveform whose sample rate does meet the Nyquist criteria. Unfortunately, in oscilloscopes, interpolation is allowed whether the interpolation would be useful or not from an aliasing standpoint, and since an upsample factor is employed, the final sample rate becomes a product of the hardware sample rate employed and this factor which often creates waveform processing situations with user sample rates extending beyond what is needed practically.

A combination of these techniques can be employed such that time-interleaving is employed to reach the Nyquist criteria and waveform interpolation is utilized to get the sample rate higher from there.

Unfortunately, often within oscilloscopes, ADCs are time-interleaved to achieve sample-rates beyond those that are required to make good measurements when the resources could be withheld to save power or utilized for other, more beneficial purposes.

So far, this discussion has focused on, bandwidth and sample rate which are so-called horizontal characteristics because they pertain to the time axis of the acquired waveform. Of similar interest are the vertical characteristics of the waveform digitizer. In other words, waveform digitizers sample a waveform in two ways. The first way has already been discussed: the discretization of the time at which samples are taken. Waveform digitizers also discretize the waveform vertically in the form of quantization. The quantization characteristic is most often stated in bits. This is because, based on the typical construction of ADCs, there are a number of digital codes, or possible numbers, that can exist within the vertical acquisition range of the oscilloscope. Using traditional oscilloscope terminology, an oscilloscope has traditionally displayed waveforms on a grid with eight major divisions vertically. The gain and, therefore vertical range, of the oscilloscope is usually expressed as the voltage per division (VDIV) where the signal might be acquired in a range of ±4·VDIV. For the traditional eight bit oscilloscope, there might be $2^8=256$ digital codes in this range. This quantization causes small errors in the waveform acquired which shows up statistically as a form of noise called quantization noise. To reduce this noise, oscilloscopes have been introduced, usually at slower sample rates, with higher resolution. Higher resolution means higher bits which means more codes which means less quantization noise.

Just as time-interleaving can be utilized to increase sample rate, vertical-interleaving can be utilized to increase resolution as proposed in M. McTigue and P. Byrne, "An 8-gigasample-per-second, 8-bit data acquisition system for a sampling digital oscilloscope." Hewlett-Packard Journal, pp. 11-23, October 1993. Vertical interleaving is a technique whereby multiple ADCs sample the same analog input signal simultaneously, but each of the multiple ADCs sample the signal with different vertical offset amounts. Usually these different offsets are in multiples of specific fractions of a code. As an example, if two 8-bit ADCs sample at 5 GS/s, but the second ADC samples the waveform offset by half a code from the first ADC, then the two acquisitions from each of the ADCs can be put back together to form a resultant 5 GS/s, 9-bit acquisition.

While the finite resolution of the ADC creates noise, there are other sources of noise in the oscilloscope channel as well, mostly due to the front-end amplifier. In general, all forms of noise whether created by quantization or other effects are equally bad. For this reason, a figure-of-merit was established to describe the quality of a waveform digitizer or ADC. This figure-of-merit is called effective number of bits (ENOB). ENOB are calculated according to the signal to noise ratio (SNR) (in dB) as:

$$ENOB = \frac{SNR - 1.76}{6.02}$$

It can be shown that if an ADC with a given number of bits is perfect in all ways other than the fact that it quantizes an analog signal with a given number of bits, the SNR impact due to quantization noise will be such that the ENOB will equal the number of bits. Other additional sources of noise will degrade the ENOB.

There are mathematical ways of theoretically improving resolution that are so commonly used that these methods also appear in the channel menu of modern oscilloscopes. One method is called enhanced resolution (ERES). Generally, ERES is specified with the number of bits improvement desired, and this bits improvement specified drives a Gaussian filter as described in B. Orwiler, Oscilloscope Vertical Amplifiers—Circuit Concepts, pp. 21-38. Tektronix, 1 ed., 1969. The theoretical bits improvement desired determines the impulse response of filters as shown in FIG. 5. As shown in FIG. 6, the theoretical bits improvement comes as a result of a magnitude response effect that changes the −3 dB bandwidth of the channel. Unfortunately, the theoretical improvements are often not met and the actual improvement is unknown to the oscilloscope user. Furthermore, because the ERES filtering is manually controlled, there are often situations with regard to desired or needed bandwidth by the user which would benefit but ERES is not employed, resulting in waveform acquisitions that are noisier than necessary.

High resolution, like high sample-rate, is difficult to achieve because doubling either sample-rate or resolution means either doubling of ADC resources or doubling the speed of the ADC. Both lead to higher power consumption, larger size, and higher expense. As such, ADCs are precious resources.

OBJECT OF THE TECHNOLOGY

It is an object of this technology to provide for a flexible waveform digitizer capable of configuring itself and being configured to optimize resolution and effective number of bits (ENOB) while providing desired resultant bandwidth and sample rate.

Still other objects and advantages of the invention will in part be obvious and will in part be apparent from the specification and drawings.

SUMMARY

There are many factors that determine the most effective deployment of analog to digital converters (ADCs) in a waveform digitizing system. These factors include, but are not limited to:

desired bandwidth,
required hardware sample rate (to prevent aliasing) and desired hardware sample rate,
desired user sample rate,
signal paths with correlated and uncorrelated noise,
noise spectral characteristics, and
desired number of bits.

Thus, based on specification of one or several or possibly all of these factors with some prioritization by the user, the waveform digitizing system described herein configures hardware filters and the internal ADCs in an arrangement that optimizes bandwidth and sample rate horizontally and resolution and noise vertically. In cases where the desired user sample rate exceeds the hardware sample rate, waveform interpolation may be employed to automatically supply the desired user sample rate and in cases where hardware sample rate exceeds the Nyquist rate based on the bandwidth specified, enhanced resolution (ERES) filtering or bandwidth limiting may be automatically employed to reduce noise and therefore improve effective number of bits (ENOB).

When balancing between utilizing ADCs to increase vertical resolution to reduce quantization noise, to average to reduce noise from uncorrelated noise sources, or to increase sample rate to move spectrally folded noise to other frequency locations for noise reduction through filtering, the system determines which of various methods are appropriate for ENOB improvement and chooses dynamically to provide a superior ENOB.

The system may be calibrated either dynamically, one-time during manufacture, or one-time during design, such that the spectral content of the noise is known and therefore bits improvements due to ERES or bandwidth limiting methodologies are precisely calculated and preferably reported. Similarly, ERES usage or bandwidth limiting methodologies can precisely calculate and preferably report the bits improvement.

BRIEF DESCRIPTION OF THE DRAWINGS

For a more complete understanding of the technology, reference is made to the following description and accompanying drawings, in which:

FIG. 19 is a graphical user interface portion from FIG. 15 showing priorities configuration settings;

FIG. 20 is a graphical user interface portion from FIG. 15 showing a resulting acquisition settings;

DETAILED DESCRIPTION

Figure 1:
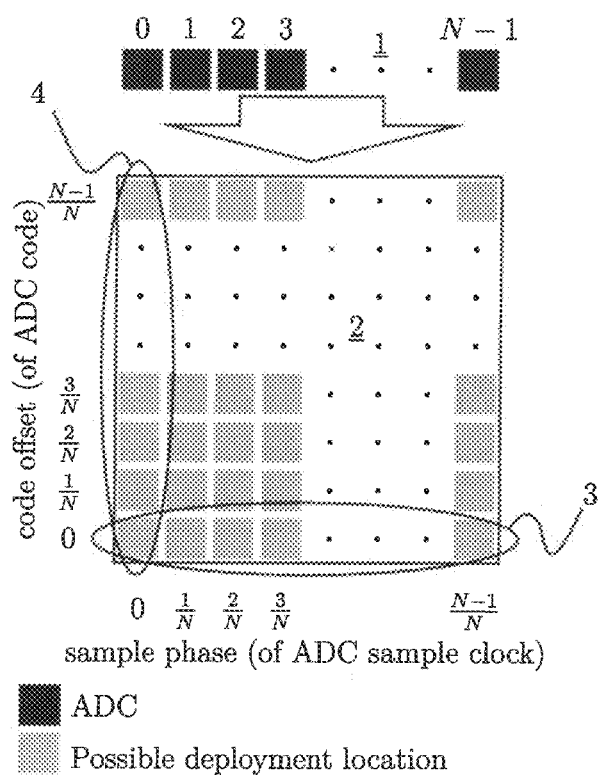
FIG. 1 shows possible deployment of analog to digital converters (ADCs) in a variable resolution oscilloscope (VRO)

With regard to analog to digital converter (ADC) deployment in a waveform digitizer, there are at least three characteristics of noise present in the system whereby the quantification of these three characteristics can be used to determine the optimum deployment from a noise perspective. The first important characteristic is the quantization noise itself.

To quantify the quantization error, consider the somewhat confusing equation (1) which describes the ADC sampling process:

Mathematically speaking, if we have an analog waveform v(t) and acquire K samples at a sample rate Fs (implying a sample period Ts=1/Fs) with a B bit quantizer at a given voltage per division (VDIV) setting, we have a vector x of waveform samples, for k∈0 . . . K−1:

$$x[k] = \ldots \ldots = \left\lfloor (v(k \cdot Ts) + 4 \cdot VDIV + \text{Offset}) \cdot \frac{2^B}{8 \cdot VDIV} \right\rfloor \cdot \quad (1)$$

$$\frac{8 \cdot VDIV}{2^B} - \ldots \ldots - 4 \cdot VDIV - \text{Offset} + \frac{1}{2^B}$$

In order to understand (1), understand that:

The sample rate is Fs and the sample period is Ts=1/Fs.

k·Ts is the time that the voltage waveform is sampled relative to the trigger time.

VDIV is the number of volts per division vertically on the oscilloscope screen and is how the gain setting of the oscilloscope is referred to by oscilloscope users. There is an implicit assumption here that there are eight vertical divisions across the screen (this may be different on different scopes).

$2^B$ is the number of codes across the screen, where B is the resolution of the scope.

8·VDIV is the number of volts from the top to the bottom of the screen.

4·VDIV is added to the sampled analog voltage because, with no offset applied, the middle of the screen vertically is zero Volts.

Offset is the offset applied to the analog waveform, in Volts.

VoltPerCode=8·VDIV/$2^B$ is the number of volts per one code of the quantizer.

$\lfloor x \rfloor$ means the floor of x which means the next lower integer that is less than or equal to x.

We are assuming in (1) that the waveform fits on the screen. When the waveform goes beyond the screen boundaries of ±4·VDIV, the value inside the floor function must be clipped to the minimum code (0) or maximum code ($2^B$−1).

The final addition of $\frac{1}{2^B}$ is not intuitive and is added so that when a full-scale sinusoid is applied (i.e. one with an amplitude of 4·VDIV or a peak-peak amplitude of 8·VDIV), the mean quantization error is zero.

The result x[k] is in quantized Volts (the floor function produced the actual integer codes).

Ideally, if the waveform were only sampled (in time), and not quantized, we would have x[k]=v(k·Ts), but because it is quantized, we have instead:

$$x[k]=v(k \cdot Ts)+\varepsilon[k]$$

or said differently, a quantization error of:

$$\varepsilon[k]=x[k]-v(k \cdot Ts)$$

As such, we have an error vector that when subtracted from the waveform produces the exact voltage. Said differently, we can think of the acquired waveform as exact samples of the analog waveform with a noise waveform added to the analog waveform.

By examining (1), one can see that the distance between each possible voltage is 8·VDIV/$2^B$. This leads statistically to a uniformly distributed error of ±½ code, or a root mean square (RMS) noise of:

$$\sigma^2 = \left(\frac{8 \cdot VDIV}{2^B}\right)^2 \cdot \int_{-\frac{1}{2}}^{+\frac{1}{2}} x^2 \cdot dx$$

and therefore:

$$\sigma = \frac{1}{2 \cdot \sqrt{3}} \cdot \frac{8 \cdot VDIV}{2^B} = \frac{4 \cdot VDIV}{2^B \cdot \sqrt{3}} \quad (2)$$

This calculation is what leads to the common expression of effective-number-of-bits or effective number of bits (ENOB). The RMS value of a full-scale sinusoid is $4 \cdot VDIV/\sqrt{2}$. Thus, signal to noise ratio (SNR) can be expressed as:

$$SNR = 20 \cdot \log\left(\frac{\frac{4 \cdot VDIV}{\sqrt{2}}}{\frac{4 \cdot VDIV}{2^B \cdot \sqrt{3}}}\right) = \ldots \ldots = \quad (3)$$

$$20 \cdot \log\left(2^B \cdot \sqrt{\frac{3}{2}}\right) = \ldots \ldots = 20 \cdot \log(2^B) + 20 \cdot \log\left(\sqrt{\frac{3}{2}}\right) =$$

$$\ldots \ldots = 20 \cdot B \cdot \log(2) + 10 \cdot \log\left(\frac{3}{2}\right) = \ldots 6.02 \cdot B + 1.76$$

This is the best case SNR given a B bit quantizer. Solving for B:

$$B = \frac{SNR - 10 \cdot \log\left(\frac{3}{2}\right)}{20 \cdot \log(2)} \approx \frac{SNR - 1.76}{6.02} \quad (4)$$

Thus, for a given SNR, we can compute the (effective number of) bits for the system. Generally, distortion components are also considered, so strictly speaking, the measurement of ENOB contains the distortion as well, but (4) can be thought of as the ENOB due to noise effects only. If there is no other source of noise in the system, this will evaluate to the number of bits in the quantizer or converter.

The vertical ADC resolution sets the best case noise floor in the system. In practice, increasing only vertical resolution reaches diminishing returns. This is because limited resolution is not the only source of noise in the oscilloscope, and usually is not even the dominant noise source. The dominant source of noise in the oscilloscope tends to be the front-end amplifier.

Figure 3:
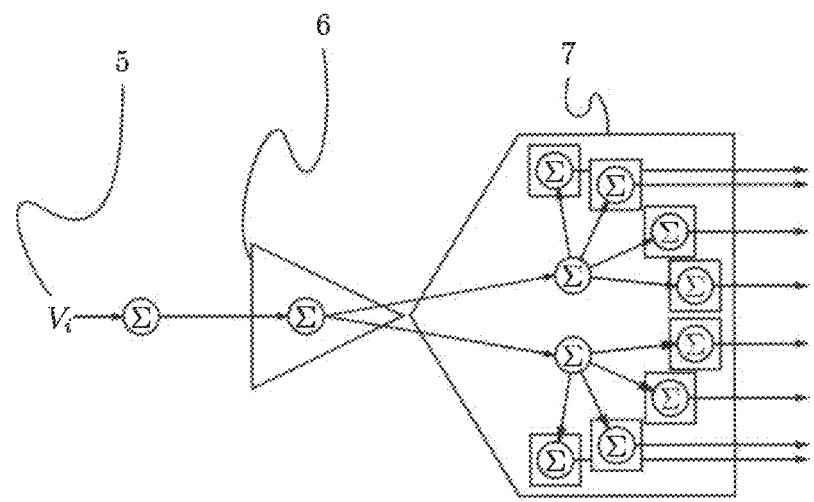
FIG. 3 shows example noise sources in an oscilloscope channel.

In FIG. 3 we see an example of noise sources in an oscilloscope channel. Here we have a user input signal [5] designated $V_{in}$, itself with noise added to it entering the oscilloscope. The front-end amplifier [6] adds noise to the signal. In this particular design, two of the front-end amplifier [6] outputs drive two inputs to an ADC chip [7] which themselves add their own noise. Each input to the ADC chip [7] drives four, internal ADCs which add noise, mostly in the form of quantization noise due to limited resolution.

It is important to realize that the often neglected noise source, the noise on the user's signal, if present, cannot be removed. This is because the oscilloscope does not know that the noise is even noise. As far as it is concerned, the noise is signal and its job is to faithfully reproduce the signal. This is an important point to remember when measuring ENOB and noise and we must remember to use a high fidelity low-noise source and sometimes filters, otherwise we might be measuring the noise in the source and not the channel.

The front-end amplifier [6] adds the most noise. Usually, it consists of multiple, selectable gain stages, so often, there is an implementation strategy that can provide the least noise relative to signal size. It's important to understand that the noise added to the signal in the frontend amplifier causes a problem in that it is indistinguishable also from the noise on the user's input signal and is common to all downstream paths.

The job of the ADC chip [7] is, as with all elements, to faithfully digitize the waveform presented to it, but the fact that the two ADC inputs add different noise is an opportunity which we will discus. Finally, each internal ADC adds its quantization noise and perhaps other types of noise.

The important parameters of each noise source in the system are:
1. The magnitude of the noise.
2. The correlation between a source and other sources.
3. The location of a noise source and how common the noise source is to the other paths through the system.
4. The spectral characteristics of the noise.

Correlation of noise sources is a term in statistics that defines how related one noise source is to another. Correlation of noise sources can be an advantage or disadvantage for noise removal through various processing techniques. An advantage is presented if, in a given stream of waveform data, a given sample is somehow related to the other sample.

Figure 4:
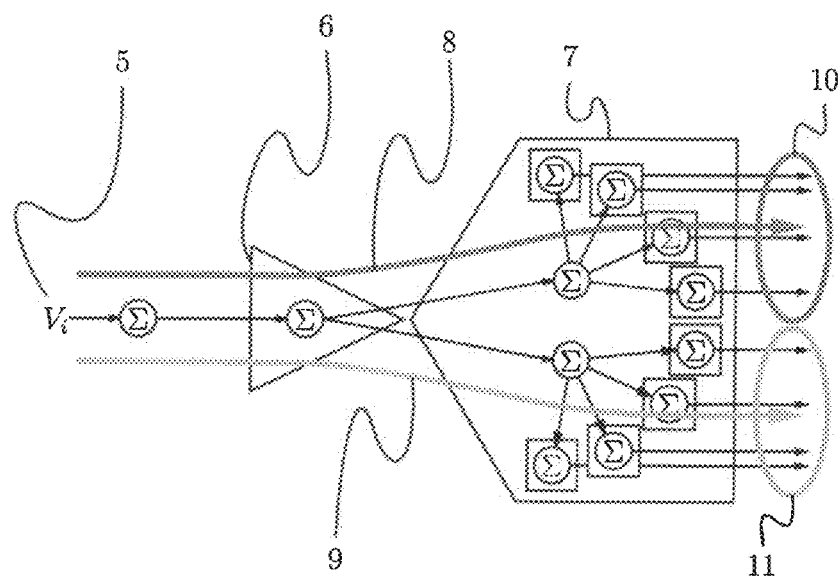
FIG. 4 shows multiple paths in an oscilloscope channel.
Figure 5:
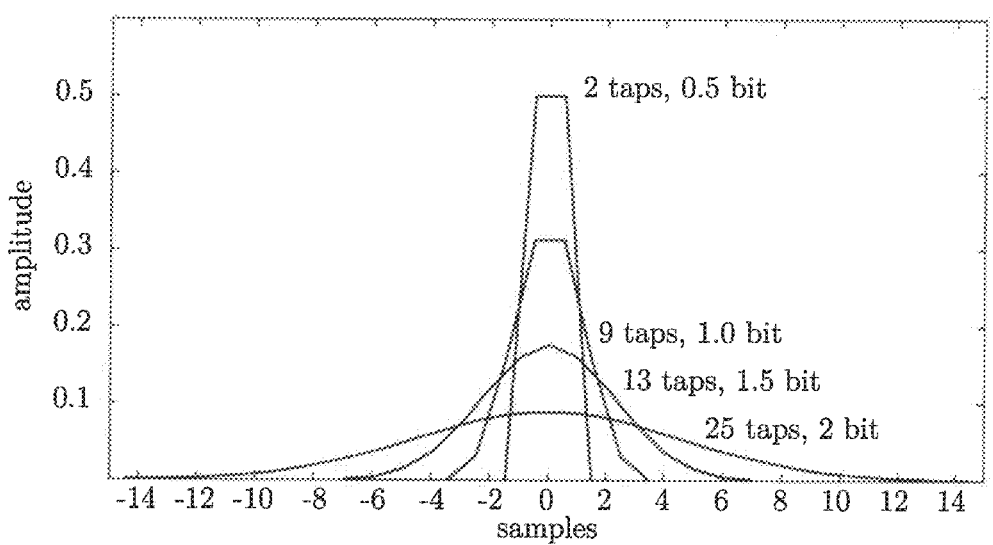
FIG. 5 is a plot of impulse responses of various enhanced resolution (ERES) filters.

A more common advantage is gained through lack of correlation of noise in multiple paths through a system. For example, in FIG. 4, regarding the multiple front-end amplifier [6] connections to the ADC chip [7], we can separate the signal into at least two system paths. Here, we have a first signal path [8] shown in a solid line and a second signal path [9] shown in a dotted line. In an ordinary arrangement, the internal ADCs to the ADC chip [7] are time interleaved, meaning that every other sample comes from ADCs in first ADC group [10] with its signal coming from the first signal path [8] and alternately from second ADC group [11] with its signal coming from the second signal path [9]. Since the two paths have in common the noise in the user's signal and the noise from the front-end amplifier [6], this noise must be correlated in each of the paths—it is the same noise. But the noise in the two separate front-end outputs/ADC inputs may not be correlated, as well as the noise from the individual digitizers. To the extent that the noise in the separate portions of the paths are uncorrelated, an advantage is presented that could be exploited.

Assuming that the internal ADCs are sampling at 5 GS/s, we have two separate 20 GS/s streams in the first signal path [8] and second signal path [9]. If the input signal content is above 10 GHz, the two streams could be arranged to sample the signal simultaneously and their average value would have less noise than an individual 20 GS/s stream, to the extent that the noise in the two paths is uncorrelated. In this case, however, the resulting averaged 20 GS/s stream would be under-sampling the signal which is generally undesirable. If the input signal content is below 10 GHz, then simultaneous sampling and averaging of the two streams would result in a sufficiently sampled 20 GS/s stream. Not only could this resulting stream be resampled back to 40 GS/s, providing the oversampling benefit provided in a time-interleaved system, each of the 20 GS/s streams could have been time interleaved originally and would still provide the same benefit. This is because one of the two streams could be resampled to the same sample phase as the other, averaged, and interpolated to provide a higher sample rate.

The benefit of this averaging would depend on two things:

1. The magnitude of the noise in the separate portions of the path related to the common portions of the path.
2. The degree of the lack of correlation between the noise in the separate portions of the path.

The quantification of the benefit can be described, in a limiting sense, as follows:
1. If all of the noise comes in the common portion of the path, the benefit is zero.
2. If al of the noise in the separate portions of the path are totally correlated, the benefit is zero.
3. If all of the noise comes in the separate portions of the path and is totally uncorrelated, benefit is the equivalent of half a bit of resolution.

Thus, the noise benefit due to averaging two streams can be bounded and is between zero and one-half bit of resolution. The zero bound is clear, averaging two streams that are the same results in no change. The half-bit resolution improvement can be described statistically.

Given two random variables with the same mean (signal content) and normally distributed, uncorrelated noise, we can write these as:

$X \sim N(\mu, \sigma_X^2)$ $Y \sim N(\mu, \sigma_Y^2)$

Where $\mu$ is the mean and u is the standard deviation. The average of these two streams can therefore be written as:

$$Z = \frac{1}{2} \cdot (X + Y) \sim N\left(\mu, \frac{1}{2} \cdot (\sigma_X^2 + \sigma_Y^2)\right)$$

If the magnitude of the $\sigma_X$ and $\sigma_Y$ is the same, then the resulting standard deviation is $\sigma/\sqrt{2}$. Looking back at (3), we see that this means that the SNR improves by $20 \cdot \log(\sqrt{2}) \approx 3$ decibels (dB) and therefore the ENOB (due to noise only) according to (4) increases by 0.5 bits.

Spectral content of noise is important to understand because often this is an area for improvement. If we have a spectral density expressed as R(f) in units of $V(rms)/\sqrt{H_z}$, the total noise in the system is:

$$\sigma^2 = \int_0^{BW} R(f)^2 \cdot df$$

If the noise is evenly distributed throughout the bandwidth BW, such that $R(f)=\overline{R}$, then we have:

$$\sigma^2 = \int_0^{BW} \overline{R}^2 \cdot df = \overline{R}^2 \cdot BW$$

and therefore:

$$\overline{R} = \frac{\sigma}{\sqrt{BW}}$$

If we were to halve the bandwidth in such a system, by employing a hard cutoff at BW/2, we have:

$$\sigma_{bwl}^2 = \int_0^{\frac{BW}{2}} \overline{R}^2 \cdot df = \overline{R}^2 \cdot \frac{BW}{2} = \frac{\sigma^2}{BW} \cdot \frac{BW}{2} = \frac{\sigma^2}{2}$$

and therefore:

$$\sigma_{bwl} = \frac{\sigma}{\sqrt{2}}$$

Looking back at (3), we see that this means that the SNR improves by $20 \cdot \log(\sqrt{2}) \approx 3$ dB and therefore the ENOB (due to noise only) according to (4) increases by 0.5 bits.

This is the precept behind enhanced resolution (ERES) filtering, although the typical ERES filter applied tends not to have the brick-wall shape in this example. The principle, however, is exactly the same. A filter is crafted that causes the bits to increase by 0.5 bits for every halving of bandwidth.

A digital filter response is expressed as H(z). Given a noise spectral density R(z), the effect of the filter on the noise spectrum is defined as:

$$\sigma_{df}^2 = \frac{1}{2 \cdot j} \oint_C \frac{[|H(z)| \cdot R(z)]^2}{z} \cdot dz \quad (5)$$

The contour of integration is along the rim of the unit circle.

This can be simplified by substituting for z where we have chosen the sample rate arbitrarily as unity:

$$z = e^{j\omega} \quad (6)$$

$$dz = j \cdot z \cdot d\omega$$

$$\sigma_{df}^2 = \frac{1}{2} \cdot \int_0^{2\pi} [|H(z = e^{j\omega})| \cdot R(\omega)]^2 \cdot d\omega$$

Assuming evenly spread noise from zero frequency (DC) to the Nyquist rate, we have originally:

$$R(\omega) = \overline{R} = \frac{\sigma}{\sqrt{\pi}}$$

and we have:

$$\sigma_{df}^2 = \sigma^2 \cdot \frac{1}{2 \cdot \pi} \cdot \int_0^{2\pi} |H(z = e^{j\omega})|^2 \cdot d\omega$$

ERES filtering is typically performed with a Gaussian filter as put forth by B. Orwiler, Oscilloscope Vertical Amplifiers—Circuit Concepts, pp. 21-38. Tektronix, 1 ed., 1969. A Gaussian filter is a filter whose impulse response is a Gaussian which provides an ideal pulse response in that there is no overshoot. The central limit theorem states that convolving many rectangular, or boxcar filters produces a response that tends towards a Gaussian shape and that is how ERES filters are created. With this in mind, the simplest ERES filter is the two-tap boxcar filter with taps $$\left[\frac{1}{2}, \frac{1}{2}\right].$$

As such, this filter simply averages two points. The response of this filter is:

$$H(z) = \frac{1}{2} + \frac{1}{2} \cdot z^{-1}$$

$$\sigma_{eres}^2 =$$

$$\sigma^2 \cdot \frac{1}{2 \cdot \pi} \cdot \int_0^{2\pi} \left|\frac{1}{2} + \frac{1}{2} \cdot e^{-j\omega}\right|^2 \cdot d\omega = \ldots \ldots = \sigma^2 \cdot \frac{1}{2 \cdot \pi} \cdot \int_0^{2\pi} \cos^2\left(\frac{\omega}{2}\right) \cdot d\omega =$$

$$\ldots \ldots = \sigma^2 \cdot \left[\frac{\omega}{4 \cdot \pi} + \frac{1}{2 \cdot \pi} \cdot \sin\left(\frac{\omega}{2}\right) \cdot \cos\left(\frac{\omega}{2}\right)\right]_0^{2\pi} = \ldots \ldots = \sigma^2 \cdot \frac{1}{2}$$

and thus:

$$\sigma_{eres} = \frac{\sigma}{\sqrt{2}}$$

This is the so-called 0.5 bit ERES filter. This result should not be surprising because we are effectively averaging two adjacent points and since the noise in the two adjacent sample points are assumed to be not correlated, we get the half bit improvement foretold in the averaging discussion with the understanding that this half bit improvement is only possible if the noise bandwidth extends to the Nyquist rate as we've stipulated. If the noise bandwidth did not extend to the Nyquist rate, the spectral density of the noise could not be uniform and we could not get the full half bit improvement.

To improve resolution further, we can cascade many stages S of these two-tap averaging filters, and we find that the effective bits improvement is:

$$B = -\frac{1}{2} \cdot \log_2\left(\frac{1}{\pi} \cdot \int_0^{\pi} \cos^{2 \cdot S}\left(\frac{\omega}{2}\right) \cdot d\omega\right)$$

To solve this, we make use of the identity:

$$\int \cos^n(a \cdot x) \cdot dx = \frac{1}{n \cdot a} \cdot \cos^{n-1}(a \cdot x) \cdot \sin(a \cdot x) + \frac{n-1}{n} \int \cos^{n-2}(a \cdot x) \cdot dx$$

and thus:

$$\frac{1}{2 \cdot \pi} \cdot \int_0^{2\pi} \cos^{2 \cdot S}\left(\frac{\omega}{2}\right) \cdot d\omega = \ldots \ldots =$$

$$\frac{2 \cdot S - 1}{2 \cdot S} \cdot \frac{1}{2 \cdot \pi} \cdot \int_0^{2\pi} \cos^{2 \cdot (S-1)}\left(\frac{\omega}{2}\right) \cdot d\omega = \ldots \ldots = \prod_{s=1}^{S} \frac{2 \cdot s - 1}{2 \cdot s}$$

So, for a given number of stages S, the improvement in bits ΔB can be written as:

$$\Delta B = -\frac{1}{2} \cdot \log_2\left(\prod_{s=1}^{S} \frac{2 \cdot s - 1}{2 \cdot s}\right)$$

The 3 dB bandwidth as a fraction of the Nyquist rate of such a number of cascaded sections is found by solving:

$$\left|\left(\frac{1}{2} + \frac{1}{2} \cdot e^{-j \cdot 2 \cdot \pi \cdot f}\right)^S\right| = \frac{1}{\sqrt{2}}$$

to arrive at:

$$f_{3dB} = \frac{1}{\pi} \cdot \tan^{-1}\left(\frac{\sqrt{2^{\frac{2 \cdot S - 1}{S}} \cdot \left(1 - 2^{-\frac{1}{S}}\right)}}{2^{\frac{S-1}{S}} - 1}\right)$$

Note that when S=1, you need to take the limit as S→1 and you arrive at $f_{3\ dB} = \frac{1}{2}$.

Figures 6, 7:
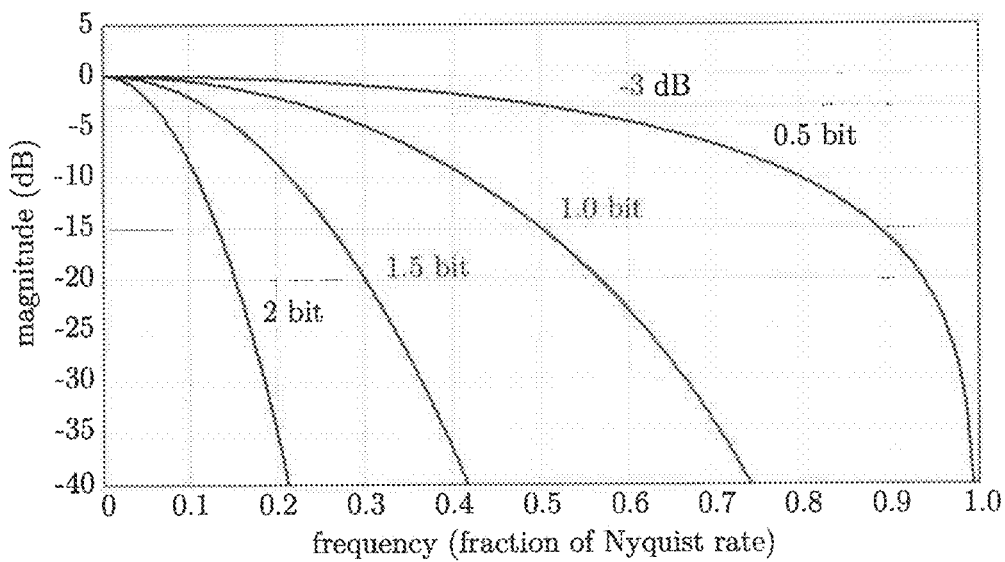
FIG. 6 is a plot of magnitude responses of various ERES filters.
FIG. 7 is a table showing bandwidth and effective number of bits (ENOB) improvement for integer number of stages of ERES filters.

The bit improvement for some numbers of stages are shown in FIG. 7.

In practice, fractional bits are not preferred improvements, so instead of cascading averaging stages, we find the fractional value of S that produces the improvement in bits that we want and simply find the filter that fits the response. Thus, the bit improvements and the number of stages for these improvements is tabulated in FIG. 8. When the ERES filters are calculated, we find that we need very large numbers of stages and therefore very long filters. In practice most of the filter coefficients are insignificant as the large number of cascades better approximates a true Gaussian shape and we know that the tails of a Gaussian tend to be very small values.

The discussion regarding improvements in ENOB due to the use of ERES provided so far is a theoretical improvement in the effective bits based on an assumption of white noise, or noise that is constant in frequency from DC to the Nyquist rate of the sampled signal. This theoretical improvement is interesting, but the actual improvement depends on the spectral content of the noise along with the magnitude response of the enhanced resolution filter. Said differently, considering (5) and (6), the actual noise improvement involves the consideration of the actual noise density specified as R(z), coupled with the magnitude response H(z) of the filter employed. The magnitude response of the filter is known, and the noise density R(z) can be determined during a calibration step or in the design of the instrument.

To compute the noise density of a waveform, consider a noise waveform provided as a vector x consisting of K samples of data points, sampled at a sampler rate Fs, we have each sample z[k] being a sample at a time defined, for k∈0 . . . K−1:

$$t[k] = k/Fs$$

Its Fourier transform is calculated as a vector X consisting of N=K/2 data points as, for n∈0 . . . N:

$$X[n] = \sum_{k=0}^{K-1} x[k] \cdot e^{-j \cdot \frac{n \cdot k}{K}}$$

Each value of X is a complex value containing the amplitude and phase of a cosine wave for frequencies with regard to a sample rate Fs as:

$$f[n] = \frac{n}{N} \cdot \frac{Fs}{2}$$

where the amplitude is defined as:

$$A[n] = \begin{cases} 2 \cdot |X[n]| & n \in 1 \ldots N-1 \\ |X[n]| & \text{otherwise} \end{cases} \quad (7)$$

In other words, the amplitude is twice the magnitude of the complex number at frequency bin n, except at zero frequency (n=0) or the Nyquist rate (n=N).

The phase is defined as:

$$\theta[n] = \arg(X[n])$$

for real valued signals x, the phase will be zero or π at zero frequency and the Nyquist rate.

Thus, the Fourier transform decomposes the time-domain vector x into a frequency-domain vector X such that:

$$x[k] = \sum_{n=0}^{N} A[n] \cdot \cos(2 \cdot \pi \cdot f[n] \cdot t[k] + \theta[n])$$

This formula is usually defined without amplitude and phases of cosine waves as:

$$x[k] = \frac{1}{K} \sum_{n=0}^{K-1} X[n] \cdot e^{j\frac{n \cdot k}{K}}$$

We have defined how we can compute an amplitude vector A using (7). It is useful to convert this into effective voltage in the frequency domain:

$$R[n] = \begin{cases} A[n] & n = 0 \\ \frac{A[n]}{\sqrt{2}} & \text{otherwise} \end{cases}$$

This is clear because we know that the RMS voltage of a DC signal is simply the DC level itself, but for a sine wave, the RMS value is the amplitude divided by the square root of two.

It is interesting to express the standard deviation of a time-domain noise signal as a function of the RMS voltage at each frequency bin in the frequency domain. This expression is:

$$\sigma = \sqrt{\sum_{n=1}^{N} R[n]^2}$$

Essentially, this is the square-root of the sum of the squares of the RMS values, noting that we have removed the DC component. This is the discrete version of integrating the noise for continuous spectral densities. The value R[n] is the spectral content of the noise in a bin of the discrete Fourier transform (DFT). Each bin has a frequency width given as:

$$\Delta f = \frac{1}{N} \cdot \frac{Fs}{2}$$

We can therefore calculate the power spectral density of the noise.

To summarize the preceding discussion:
1. ADC resolution is a source of noise in a waveform digitizing system and the resolution of the ADC sets the noise floor. In other words, it determines the best case SNR.
2. Channel resources in the form of independent ADCs can be deployed in either horizontal (time-interleaved) or vertical (vertically-interleaved) configurations to achieve either higher sample rate or higher resolution, respectively.
3. When configured in a time-interleaved configuration, sample rate is doubled for every doubling of the number of ADCs interleaved.
4. When configured in a vertically-interleaved configuration resolution can be improved by one bit for every doubling of the number of ADCs interleaved.
5. Depending on whether multiple signal paths are presented to each ADC and the amount of correlation of the noise in these multiple signal paths, averaging can be employed to reduce the noise. For every doubling of signal paths averaged, one could achieve up to 0.5 bits of extra ENOB by averaging multiple signal paths.
6. Depending on the spectral content of the noise in the channel, filtering can be used to improve the effective bits by up to half a bit for every halving of the ratio of filter bandwidth to the Nyquist rate. If the filter bandwidth is greater than the analog signal bandwidth, then this improvement can be performed while retaining the channel bandwidth characteristics.
7. Again, depending on the spectral content of the noise in the channel, filtering such as ERES, can be further performed to trade analog signal bandwidth for even higher effective bits.

Furthermore, simply from an oscilloscope usefulness standpoint:
1. The hardware sample rate must be maintained such that it satisfies the Nyquist criterion (i.e. is at least twice the bandwidth of the oscilloscope channel, where again, we are using the word bandwidth to describe the maximum frequency possible in the acquired analog signal).
2. It is desirable to acquire resulting waveforms that are at least 10× oversampled (i.e. Fs≥10·BW) so that useful measurements and observations can be performed.

In light of these facts, it is clear that the traditional use of ADC resources in a time-interleaved arrangement only could be wasteful if it produces sample rates in excess of the Nyquist rate
AND
the spectral content of the noise is such that operating at a high sample rate and filtering is not advantageous from a noise perspective
OR
there are multiple paths to the ADCs where the noise is sufficiently uncorrelated to benefit from an averaging configuration.

In other words, time interleaving can possibly shift noise to higher frequencies in the sampled signal if the noise itself is aliased by sampling at a lower rate. In these situations, time-interleaving to sample at a higher rate and filtering might be advantageous from a noise perspective. However, sufficiently sampling the signal on multiple paths and averaging the result might be more advantageous from a noise perspective. Or, using the ADCs in a vertically interleaved arrangement producing higher resolution might be more advantageous. In either of these situations, waveform interpolation can be utilized to produce a higher user sample rate to make the waveform more useful for analysis when the averaging methods relegate the system to a lower hardware sample rate.

Given all this, it's highly advantageous to have an oscilloscope channel optimized for various noise conditions to utilize the ADCs in the best manner possible from an effective bits standpoint while at a minimum satisfying the Nyquist criterion. This means the optimum mixture of vertical resolution improvement, high-rate sampling and filtering, and multiple path averaging to obtain the highest number of effective bits. In cases where the resulting sample rate does not meet the desire for 10× oversampling, the samples should be interpolated to provide a more useful waveform.

Therefore, to provide the most useful, high signal fidelity waveform acquisition, an ADC deployment scheme is utilized as shown conceptually in FIG. 1. If the number of ADCs in a system is N, then there are N deployable ADCs [1], each having B bits of resolution and a sample rate of Fs. There are N×N squares, each square depicting one of many ADC deployment locations [2]. The columns of the squares depict time-interleaved arrangements and each column to the right adds 1/N sample delay (of a sample period of a single ADC). The rows of the squares depict vertical-interleaved arrangements and each row going up adds 1/N code offset (of a code of a single ADC). Thus, the bottom row depicts purely time-interleaved ADC deployment locations [3] and if all of the deployable ADCs [1] are placed here, one achieves a sample rate of N·Fs and a resolution of B. Furthermore, the left column depicts purely vertical-interleaved ADC deployment locations [4] and if all of the deployable ADCs [1] are placed here, one achieves a sample rate of Fs and a resolution of $B+\log_2(N)$. Each of the deployable ADCs [1] can be placed in any of the squares to achieve a variety of system sample rates and resolution. Note that a square can have multiple occupancies as a data stream may be averaged with another to achieve an overall ENOB improvement in lieu of a pure resolution improvement. Note also that due to the spectral content and shaping of the spectrum due to sampling, it might be advantageous to deploy an ADC for time-interleaving and thus sample-rate improvement and then filter the higher sample rate signal to achieve an overall ENOB improvement. Many deployment possibilities can be made depending on noise characteristics already discussed, and user specifications regarding bandwidth and signal fidelity.

Figure 2:
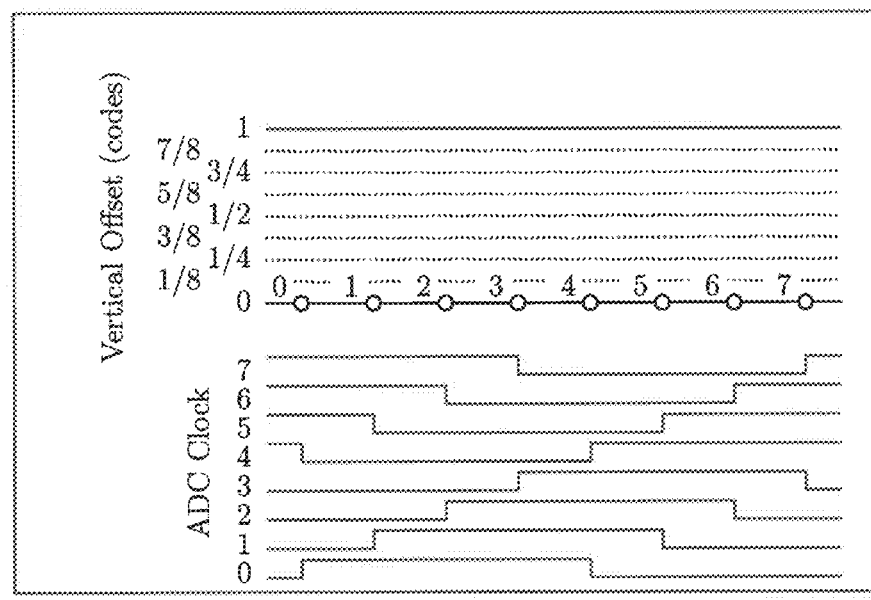
FIG. 2 shows a 40 GS/s arrangement utilizing eight 5 GS/s time-interleaved ADCs.
Figures 8, 9:
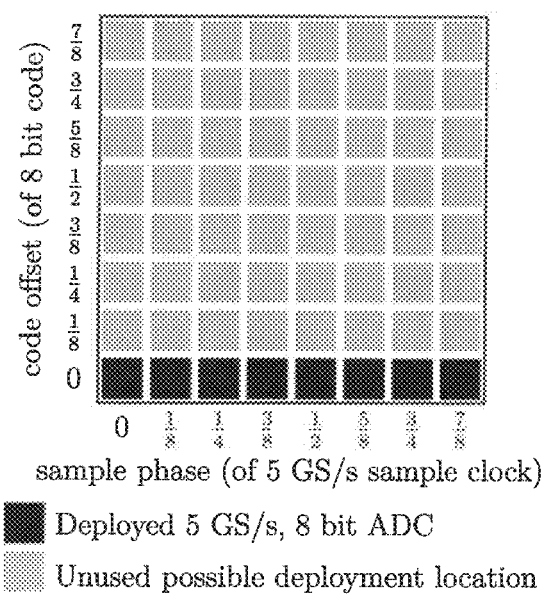
FIG. 8 is a table showing bandwidth and ENOB improvement for fractional number of stages of ERES filters.
FIG. 9 is a conceptual arrangement of eight 5 GS/s ADCs in a time-interleaved arrangement according to FIG. 2.

This deployment scheme is exemplified for an example system containing eight, 8 bit, 5 GS/s ADCs as shown in FIG. 9. This is a conceptual diagram. Thus, in the example in FIG. 9, we see 8×8=64 squares. In FIG. 9, possible deployment locations are shown as gray and deployed locations are shown black. In this example, the ADCs are all deployed in the traditional time-interleaved arrangement in accordance with FIG. 2. In other words, each of the eight ADCs are deployed along the bottom row meaning that the sample time of each ADC is horizontally offset by ⅛ of the 200 ns period of a single 5 GS/s ADC. The resolution of each ADC in this example is 8 bits. Thus, in this arrangement, the eight ADCs produce a resulting waveform acquisition of 40 GS/s with 8 bits resolution.

Figure 10:
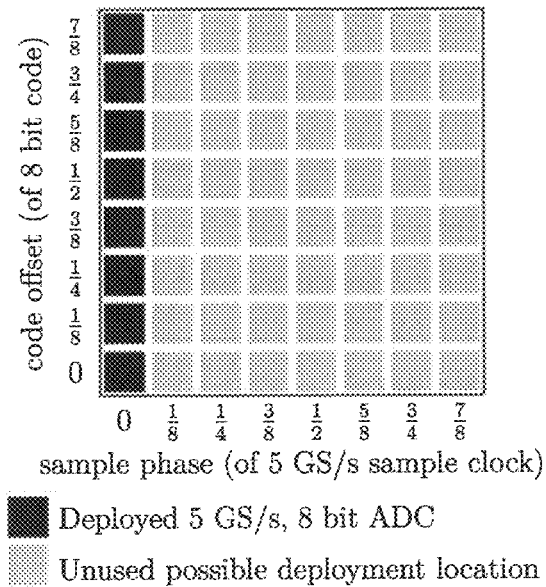
FIG. 10 is a conceptual arrangement of eight 5 GS/s ADCs in a fully vertically-interleaved arrangement.

A fully vertical-interleaved deployment arrangement is shown in FIG. 10. Here, each of the ADCs is deployed along the left column meaning that each ADC is vertically offset by ⅛ of an 8 bit code of a single ADC. Thus, in this arrangement, the eight ADCs produce a resulting waveform acquisition of 5 GS/s with $8+\log_2(8)=11$ bits resolution.

Figure 11:
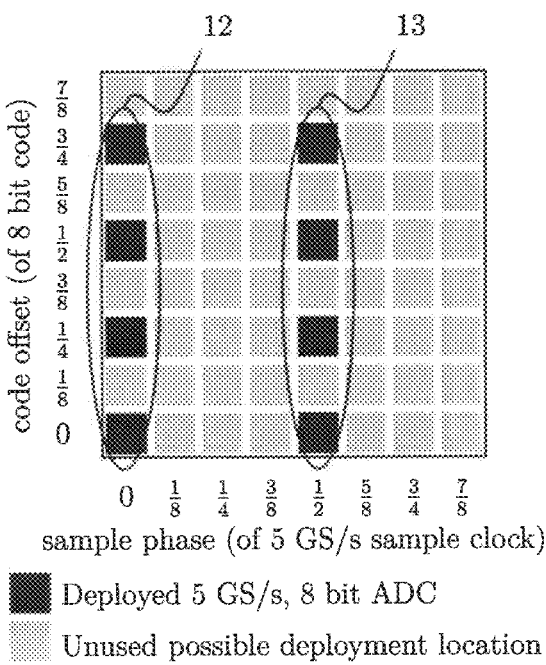
FIG. 11 is a conceptual arrangement of eight 5 GS/s ADCs in a hybrid vertical- and time-interleaved arrangement.

A hybrid time- and vertical-interleaving deployment is shown in FIG. 11. Here, we have two horizontal groups of four vertical-interleaved ADCs. The first group, vertical-interleaved ADCs horizontal group 1 [12] has each of its four ADCs offset by multiples of one-quarter code and sampling at a sample phase of zero. The second group, vertical-interleaved ADCs horizontal group 2 [13] has each of its four ADCs offset as vertical-interleaved ADCs horizontal group 1 [12] but sampling at a sample phase offset of one-half the ADC sample period. Thus, in this arrangement, the eight ADCs produce a resulting waveform acquisition of 10 GS/s with $8+\log_2(4)=10$ bits resolution. So, compared to FIG. 9, a trade-off has been made in that the sample rate has been reduced by a factor of four while the resolution has been increased by $\log_2(4)=2$ bits. Alternately, compared to FIG. 10 a trade-off has been made in that the sample rate has been doubled while the resolution has been reduced by $\log_2(2)=1$ bit.

Figure 12:
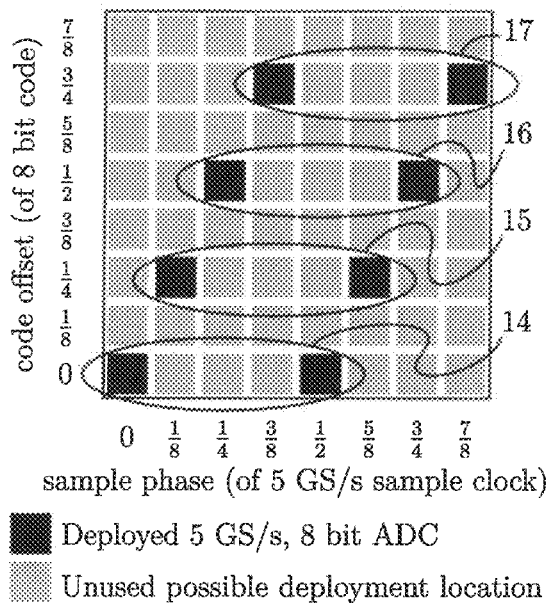
FIG. 12 is a conceptual arrangement of eight 5 GS/s ADCs in a hybrid vertical- and time-interleaved alternate arrangement where the sample rate is retained.

In FIG. 12, we provide another deployment possibility where it is possible to retain the full sample rate by viewing the system as having four vertical groups of two time-interleaved ADCs. Here, time-interleaved ADCs vertical group 1 [14] contains two ADCs time-interleaved to 10 GS/s. Additionally, time-interleaved ADCs vertical group 2 [15] contains similarly time-interleaved ADCs but vertically offset by another one-quarter code. Finally, time-interleaved ADCs vertical group 4 [17] contains similarly time-interleaved ADCs but vertically offset by a further one-quarter code. This produces a system that can be viewed, after initial time-interleaving, as having four streams of 10 GS/s and, after subtracting the vertical offsets from each stream, can be further interleaved to 40 GS/s. This is similar to adding a dither signal to the analog input signal and subtracting the dither during processing. In this case, the increase in resolution (and possible improvement in ENOB) is blurred and is not as simple to understand, yet can also provide improvements using this well-known dithering technique.

Figure 13:
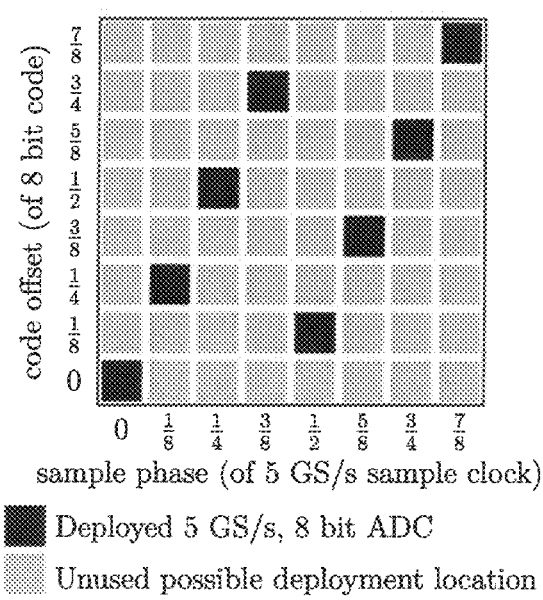
FIG. 13 is a conceptual arrangement of eight 5 GS/s ADCs in a hybrid vertical- and time-interleaved alternate arrangement.

This dithering technique is extended in FIG. 13 where each of the pairs of ADCs used to produce a 10 GS/s stream also has an alternating dither signal with the resulting signal interleaved to 40 GS/s.

Figure 14:
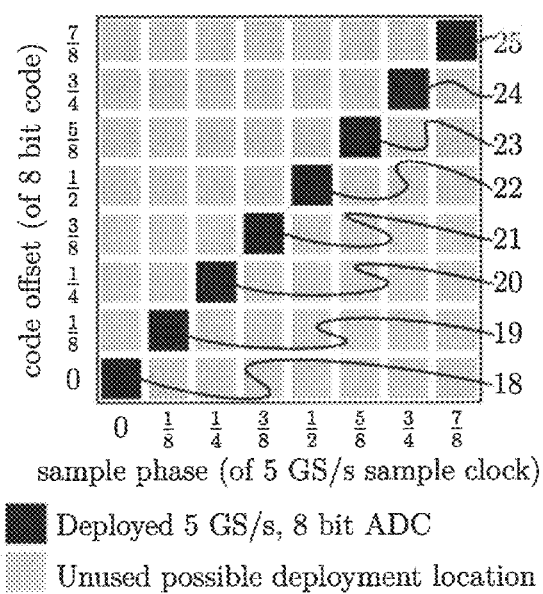
FIG. 14 is a conceptual arrangement of eight 5 GS/s ADCs in a hybrid vertical- and time-interleaved alternate arrangement.

Finally, this dithering technique is extended in FIG. 14 to an extreme where each subsequent ADC is offset 1/N code from the last.

It is important to note in all of the deployment possibilities, including those shown in FIG. 9, FIG. 10, FIG. 11, FIG. 12, FIG. 13 and FIG. 14, the deployment shown does not dictate exactly how the ADC will be used and there are often many possibilities for generation of the resultant waveform acquisition.

As an example, considering FIG. 14, We could have each of ADC 0 [18], ADC 1 [19], ADC 2 [20], ADC 3 [21], ADC 4 [22], ADC 5 [23], ADC 6 [24] and ADC 7 [25] time-interleaved to 40 GS/s after each of their offsets are removed resulting in a 40 GS/s acquisition with improved ENOB due to dithering.

We could also have each of ADC 1 [19], ADC 2 [20], ADC 3 [21], ADC 4 [22], ADC 5 [23], ADC 6 [24] and ADC 7 [25] resampled onto the same sample phase as ADC 0 [18] providing an 11 bit resolution, 5 GS/s acquisition.

We could have each of ADC 1 [19], ADC 2 [20], ADC 3 [21], ADC 4 [22], ADC 5 [23], ADC 6 [24] and ADC 7 [25] resampled onto the same sample phase as ADC 0 [18] and each stream averaged providing a 5 GS/s acquisition with up to 1.5 bits ENOB improvement if each 5 GS/s stream contained uncorrelated noise.

We could have each of ADC 0 [18], ADC 1 [19], ADC 2 [20], ADC 3 [21], ADC 4 [22], ADC 5 [23], ADC 6 [24] and ADC 7 [25] time-interleaved to 40 GS/s after each of their offsets are removed resulting in a 40 GS/s acquisition with improved ENOB due to dithering, but filter the resulting acquisition to a lower bandwidth (like 2.5 GHz for example, to provide up to a 1.5 bits ENOB improvement if the noise is white to 20 GHz).

We could have each of ADC 0 [18], ADC 2 [20], ADC 4 [22], ADC 6 [24] time-interleaved to 20 GS/s and ADC 1 [19], ADC 3 [21], ADC 5 [23] and ADC 7 [25] resampled to another 20 CS/s stream with both streams after each of their offsets are removed and averaged together resulting in a 20 GS/s acquisition with improved ENOB due to dithering and averaging.

We could have each of ADC 0 [18], ADC 2 [20], ADC 4 [22], ADC 6 [24] time-interleaved to 20 GS/s and ADC 1 [19], ADC 3 [21], ADC 5 [23] and ADC 7 [25] resampled to another 20 GS/s stream with both streams together resulting in a 20 GS/s acquisition with improved ENOB due to resolution improvement.

We could have each of four pairs of ADC 0 [18] and ADC 4 [22], ADC 1 [19] and ADC 5 [23], ADC 2 [20] and ADC 6 [24], and ADC 3 [21] and ADC 7 [25] resampled to four 10 CS/s streams after each of their offsets are removed and averaged together resulting in a 10 GS/s acquisition with improved ENOB due to dithering and averaging.

As the reader will appreciate, there are many possibilities, all of which have been anticipated and that might result in ENOB improvement. In other words, ADCs can be deployed in all variety of time-interleaved, vertical-interleaved, averaged and filtered arrangements.

In all systems containing N ADC, the inventors have anticipated that any of the $N^3$ possible deployments are possible (actually an infinite number considering that there is no real limitation on ADC vertical and horizontal spacing) and that any possibility might be preferable since it might improve ENOB while sampling at a rate sufficient to satisfy the Nyquist criteria.

Since there are possibly many deployment possibilities, during the design, manufacture, or operation of the waveform digitizer channel, efforts can be made to calibrate for the best possibility. This involves considering the desired bandwidth, and therefore resulting sample rate requirement, determining ADC deployment possibilities that can be post-processed to meet the bandwidth and sample rate requirements, determining the ENOB under each of the deployment and post-processing possibilities, and picking the one that optimizes the performance.

Depending on the deployment and poet-processing employed, at least two post-processing steps can be advantageously applied. The first is filtering, or ERES. Depending on the final sample rate arrived at and the bandwidth specified, ERES techniques can be applied to further improve ENOB. In a preferred embodiment, filtering is automatically employed to provide the best user results without having the user manually employ the technique. Some of advantages are that as sample rates change, the ERES specification which is usually made in bits, with a resulting theoretical reduction in bandwidth as a fraction of sample rate does not need to be recalculated by the user as the inventors have determined that generally bandwidth is a specification that the user must make and must be held constant.

The second post-processing step related to the first is interpolation. We have already noted that there will be times when hardware sample rate is reduced in lieu of other ADC deployments that improve ENOB. These reductions are such that the Nyquist criteria is met on the channel, but the sample rate might not be ideal for the user, like the 10× ratio of sample rate to bandwidth already alluded to. In the preferred embodiment, interpolation is automatically employed to provide the best user results without having the user manually employ the technique. Some of the advantages are that as sample rates change, the interpolation specification which is usually made as an upsample factor, does not need to be recalculated by the user as the inventors have determined that generally 10× sample rate ratio (or some other ratio possibly specified by the user) should usually be held constant.

It should be noted that there are cases where decimation or throwing away of resulting samples is advantageous. An example of this situation is when high hardware sample rates, which spread or move noise to higher frequencies, coupled with filtering techniques, are used to improve ENOB. In such a situation, the sample rate ratio might be higher than desired and decimation can be employed to reduce downstream processing burden.

In cases where the user is specifying sample rate over bandwidth, it may be preferable to reduce bandwidth as sample rate is modified. In these cases, hardware filtering can be employed to mitigate possible aliasing. Furthermore, when hardware filtering is employed to lower the Nyquist rate, further digital filtering can be used with or without decimation to provide a desired user sample rate.

Therefore, in preferred embodiments for implementations within oscilloscopes, the user interface of the oscilloscope has information that shows the resolution of the channel. This information can be made available to the user in two ways. One is to display the noise characteristics of the channel for each acquisition configuration in noise power, SNR, or preferably in bits (according to (4)). Another is to display the characteristics of how the acquisition is being performed. In a preferred embodiment, when the ADCs are deployed in a resolution improving configuration, the resolution is displayed in an acquisition configuration menu or indicator as $B+\log_2(N)$ where B is the resolution of a single ADC and N is the number of ADCs deployed in a resolution improvement configuration. Then, depending on ERES or other filtering employed, the bit improvement can be shown due to filtering, either as a theoretical 0.5 bits per halving of bandwidth or as the true, measured improvement. Furthermore, depending on any averaging techniques employed, the bit improvement can be shown either as a theoretical 0.5 bits per doubling of averaged streams or as the true, measured improvement. These could be shown on a per channel basis.

Insofar as an actual implementation of a variable resolution oscilloscope is concerned, it must be pointed out that up until now, no oscilloscope is believed to dynamically configure its acquisition settings based on a resolution requirement. Up until now, oscilloscopes have the user specify a bandwidth, sample rate, and memory length, sometimes calculate the sample rate from a maximum memory specification, but the resolution of the oscilloscope is fixed. One confusing aspect is that many oscilloscopes in the past have an ERES post-processing step on the user interface that specifies the number of bits gained, thereby giving the oscilloscope user the illusion that bits of effective resolution are being gained by the employment of such filters, but the actual gains are a function of the noise spectrum and are only effective to the degree specified under very specific situations. As we've seen, the ERES gain specified is only truly seen when the noise and the oscilloscope bandwidth extends exactly to the Nyquist rate of the system.

A way of implementing an algorithm for setting the oscilloscope acquisition settings is provided in a reference implementation whose Python code is provided in an appendix to this disclosure.

Figure 15:
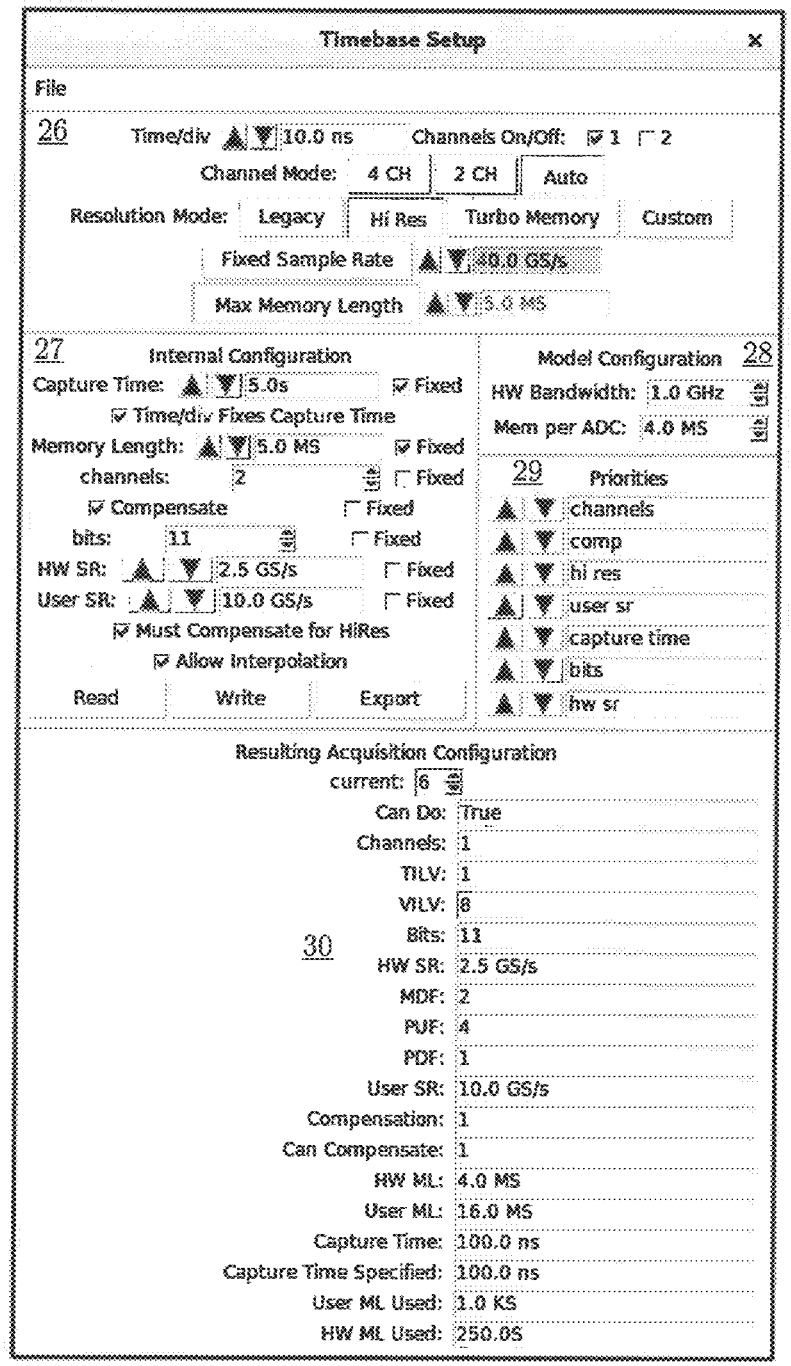
FIG. 15 is a graphical user interface showing a reference implementation for determining variable resolution oscilloscope settings.

A dialog (e.g., a user interface) which shows how a reference implementation can be constructed is provided in FIG. 15. The dialog shows settings of an oscilloscope but may not be a user interface presented by the oscilloscope. Rather, the dialog shown in FIG. 15 may be a user interface shown in a separate device during design and testing of the technologies described herein, and is illustrated herein for simplicity, rather than showing the same settings on various different screens of a user interface of an oscilloscope.

The dialog in FIG. 15 is broken into multiple sections: a user interface [26] area, an internal configuration [27] area, a model configuration [28] area, a priorities configuration [29] area, and a resulting acquisition configuration [30] area. These dialog areas are shown separately in FIG. 16, FIG. 17, FIG. 18, FIG. 19, and FIG. 20 to improve readability.

Figure 16:
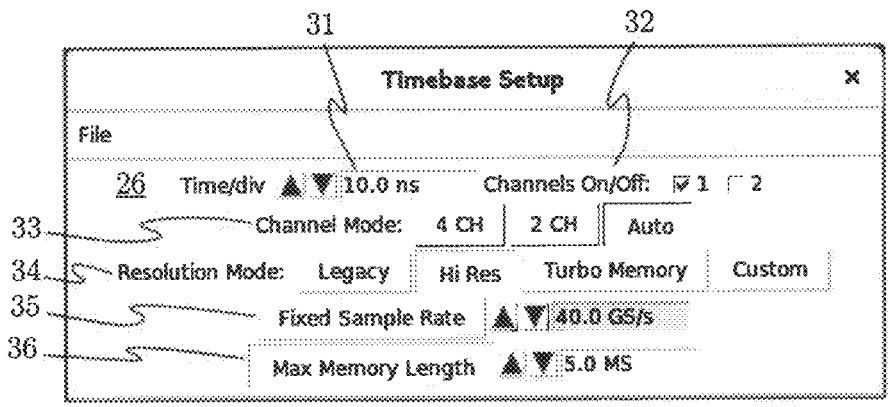
FIG. 16 is a graphical user interface portion from FIG. 15 showing oscilloscope user control settings.

The user interface [26] area, shown in FIG. 16, is meant to present the oscilloscope features that are configurable by a user using selectable user Interface elements of an oscilloscope. In other words, these are the settings that would be typically exposed on the user interface of an oscilloscope in various locations. On LeCroy oscilloscopes in particular, the user can configure the time base setting [31] by turning a knob on the front of the oscilloscope. The time base setting [31] in these examples is specified as the amount of time per division across the screen, with typically ten divisions making up the total desired capture time. The channels on/off setting [32] identifies the number of channels that are on or off, and may be set by user-selectable physical or virtual buttons that turn each channel on/off. In this particular implementation, the channels on/off setting [32] refers to channels that are turned on and off within a pair of channels.

The user can specify the channel mode setting [33] using one or more buttons (e.g., physical, softkey, or touchscreen), which determines how the oscilloscope will be configured as channels are turned on and off. In four channel mode, the oscilloscope operates utilizing resources as if all channels are turned on, regardless of whether they actually are. In two channel mode, the oscilloscope may combine resources to provide a two channel oscilloscope with higher performance per channel. In auto mode, the oscilloscope runs in two channel mode if only two channels are on and, in four channel mode if four channels are on, effectively balancing the resource combination depending on the channel count that the user desires. In this particular implementation, the channels on/off setting [32] refers to channels that are turned on and off within a pair of channels. Although the channel mode setting [33] refers to the entire oscilloscope, sometimes, as in this implementation, the oscilloscope is separated logically into two pairs of channels, and these pairs of channels provide the possibilities for resource combination. Sometimes this is a result of physical connections inside the oscilloscope acquisition setting. Thus, in two channel mode, resources can be combined on channels one and two, and on three and four, but not between the channels. Oscilloscopes may exist that have different limitations than this.

In oscilloscopes, like LeCroy oscilloscopes, the user may be able to control the sample rate and memory length in two different ways. When the fixed sample rate [35] is specified, for example due to user input that interacts with the oscilloscope to specify that the sample rate is to be fixed, the sample rate is entered directly by the user. As the time base setting [31] is modified due to user input, the oscilloscope determines the memory length by calculating the number of samples at a specified sample rate to provide the capture time specified by the time base setting [31]. The oscilloscope will limit the time base setting [31] in this mode to the maximum memory available in the instrument.

Another way to control the sample rate and memory length is by specifying a max memory length [36] and entering this maximum memory length directly. In this mode, the oscilloscope will use the highest sample rate possible to achieve a memory length less than or equal to the maximum memory specified.

The settings discussed so far have been implemented previously in LeCroy oscilloscopes. LeCroy competitors offer variations on these modes.

The resolution mode [34] settings provides a unique user input mechanism. Each of the resolution mode [34] settings are associated with a collection of oscilloscope settings and/or preferences, and these settings/preferences change based on which resolution mode [34] setting the user selected. Here we see four different modes, although more are possible. The legacy mode, when specified by the user, causes the oscilloscope to operate as previously described, The HiRes mode is meant to specify the high resolution modes that is object of this invention. Turbo memory mode is another mode that will be described in detail and custom mode provides either engineers designing the instrument or possibly users to provide their own rules for how the oscilloscope operates. Note that any of these modes are shown in a manner that simply uncovers the possibility for operating in these modes. The actual oscilloscope user interface may not have specific buttons for these modes or labels that match, depending on user interface requirements.

Figure 18:
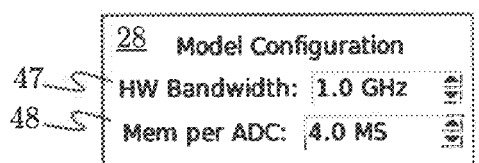
FIG. 18 is a graphical user interface portion from FIG. 15 showing oscilloscope model configuration settings.

FIG. 18 shows the model configuration specified in a model configuration [28]. This area encapsulates the limitations that are variable for given oscilloscope models. In other words, the model configuration [28] may show settings or features that are specific to a particular model of an oscilloscope. In the particular oscilloscope family under consideration, each oscilloscope has a 40 GS/s ADC shared between each pair of two channels, each ADC consisting of eight internal 5 GS/s ADCs, each with an amount of memory behind it specified in memory per ADC configuration [48]. Each model also has a specified hardware bandwidth specified in the hardware bandwidth configuration [47].

Figure 17:
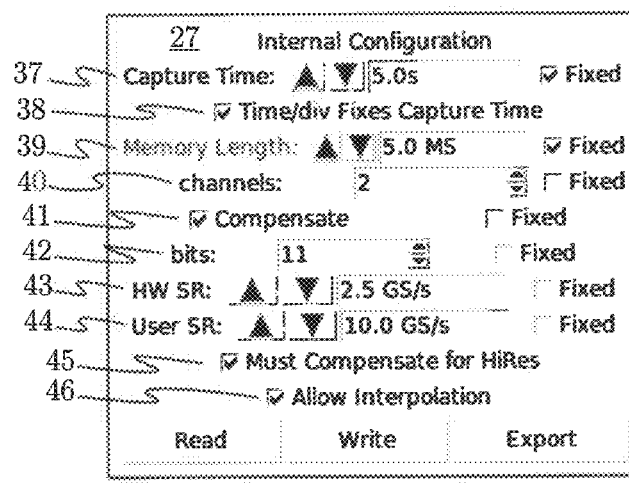
FIG. 17 is a graphical user interface portion from FIG. 15 showing internal configuration settings.

The internal configuration [27] is shown in FIG. 17. This area contains various settings and preferences for how the user specification in a user interface [26] are combined with the hardware specification provided in a model configuration [28] to arrive at acquisition system configuration possibilities. At least some of the information presented in the internal configuration [27] may be unique to a particular resolution mode [34] such that each resolution mode [34] may have its own internal configuration [27] that is applied upon selection of the corresponding resolution mode [34]. In this manner, the internal configuration [27] may be a largely predetermined configuration (with some settings such as channels configuration [40] being specified by information in the user interface [26]) that is combined with the other settings to determine an overall oscilloscope configuration. Some of the rules are directly entered from or are derived from a user interface [26] and others are specified or derived from settings that preferably the scope designer, but possibly a user specifies. In some implementations, oscilloscope users may be unable to modify at least some of the information presented in the internal configuration [27]. Rather, this information may be pre-assigned to a corresponding resolution mode [34].

Turning now to the specifics of the internal configuration [27], the capture time configuration [37] contains the capture time desired by the user. This may be the maximum capture time that is presented on an oscilloscope display based on the max memory length [36]. In those examples in which the capture time configuration [37] is longer than the amount of memory provided by the max memory length [36], the oscilloscope may only fill part of the oscilloscope display with waveform information. In one implementation, the capture time configuration [37] could be specified directly by a user, but in a preferred implementation, this is based on the time base setting [31] and is fixed based on the setting of the time/div fixes capture time configuration [38]. As mentioned previously, in legacy mode and in depending on a max memory length [36], the memory length might be fixed to a maximum value as shown. The number of channels in use is shown in channels configuration [40]. In a high resolution setting, the maximum number of bits of resolution might be specified in bits configuration [42].

Based on the aforementioned discussion of ADC utilization and deployment possibilities, we have a minimum hardware sample rate specified in hardware sample rate configuration [43]. The hardware sample rate configuration [43] may specify a lower bounds at which the oscilloscope may sample. The user sample rate shown in user sample rate configuration [44] is a function of the configuration in the user interface [26] and it is the difference between the user sample rate configuration [44] and the hardware sample rate configuration [43] that offers configuration variations to employ to lead to higher resolutions. In other words, user sample rate configuration [44] is the desired sample rate and, should the oscilloscope configuration mechanisms select a sample hardware sample rate that is lower than the user sample rate configuration [44], the oscilloscope may upsample the acquired signal to achieve the user sample rate configuration [44].

An item that should be understood in these implementation strategies is that of digital compensation. Digital compensation is poet processing of waveforms to achieve higher signal fidelity. Typically, but not always, digital compensation requires that the Nyquist rate of the digitizing system not be violated, meaning that the hardware sample rate must stay at or above one-half the hardware bandwidth of the system. Although sometimes the Nyquist limitation does not need to be met for certain types of compensation, here in this preferred embodiment, we are making this assumption and the rules can specify whether compensation is absolutely required or not in compensation configuration [41]. For example, should the compensation configuration [41] be set, the oscilloscope may prioritize those configurations in which the resulting acquisition includes sufficient information to permit compensation.

Should the compensation configuration [41] be unselected, the oscilloscope may be more likely to select configurations in which the signal is sampled close to the Nyquist limitation such that it is more difficult to compensate the signal. User selection of the "Fixed" user interface element next to the compensation configuration [41] specifies whether a configuration that permits compensation is required. Also, when ADCs could be configured in an optimal manner for resolution improvements that cause the hardware sample rate to differ from the user sample rate, the specification in allow interpolation configuration [46] determines whether upsampling, or interpolation may be employed to achieve the final user sample rate. By the way, it should be noted that this can also be used to facilitate memory length improvements as well.

Thus, the user specifications in the user interface [26] can be combined with the model limitations in the model configuration [28] and the configuration rules in the internal configuration [27] to provide various possibilities for configuring the acquisition system. Given a user specification and model and internal configuration rules, there are likely multiple possible configurations that can satisfy one of three criteria: (1) Either the users desires cannot be met for the particular configuration, which should cause the oscilloscope to restrict this choice, or (2) there is exactly one acquisition configuration that meets the users desires, in which case it should be implemented, or (3) possibly there are many acquisition configuration possibilities and one must be chosen.

This is where the priorities configuration [29] comes in as shown in FIG. 19. These priorities provide means for determining from a large set of acquisition settings, which satisfy settings presented in the user interface [26], the internal configuration [27], and the model configuration [28], which setting should be chosen. The priorities configuration [29] shows, not in a limiting sense, seven priorities. These priorities might be hard coded to create a certain user interface behavior or exposed to the user to create a custom user interface experience. Like with the internal configuration [27], the priorities may be specific to the selected resolution mode [34], such that different resolution modes have different corresponding priorities (and internal configuration [27]).

Here, again not in a limiting sense, we have chosen to prioritize, (1) the number of channels available in a first priority [49], (2) whether digital compensation can be achieved in a second priority [50], (3) whether the oscilloscope operates in a high resolution mode (i.e. whether the resolution is above eight bits in this particular instrument) in a third priority [51], (4) the final user sample rate achieved in a fourth priority [52], (5) the capture time in a fifth priority [53], (6) the number of bits of resolution in a sixth priority [54], and (7) finally the hardware sample rate achieved in a last priority [55]. Many prioritization possibilities exist, even beyond those shown.

Once the acquisition setting possibilities have been determined (i.e., various different sets of configuration settings that satisfy the elements illustrated in user interface sections [26], [27], and [28]), and one specific set of acquisitions settings has been chosen based on the priorities specified in priorities configuration [29], a final resultant set of acquisition settings is determined. Such acquisition settings are shown in resulting acquisition configuration [30] in FIG. 20. Here we see whether there are any possibilities, as the desired objective can achieved setting [57] indicates. Moreover, the resulting possibilities 1561 enables navigation through the different possibilities, with the illustrated resulting acquisition configuration presenting the selected set of acquisition settings. The user interface presented in FIG. 20 may be that presented to an oscilloscope designer, so that the oscilloscope designer can scroll through the choices by altering the resulting possibilities [56] to see what other possibilities there were, but were rejected based on the priorities specified in a priorities configuration [29]. On an oscilloscope, the settings presented in the resulting acquisition configuration [30] may be presented on the display of the oscilloscope on various different screens.

The resultant acquisition settings shows the number of channels in use in the resulting channels achieved [58], the number of bits of resolution achievable in the resulting resolution achieved [61], the hardware sample rate in resulting hardware sample rate achieved [62], the user sample rate achieved in resulting user sample rate achieved [66] (e.g., the sample rate after any upsampling), whether the system can compensate the acquired signal in resulting determination of whether it could compensate [68], the amount of hardware acquisition memory possible in hardware memory length available result [69], the resultant memory length possible for the user in user memory length available result [70], the capture time specified in capture time specified result [72], the capture time achieved in resulting capture time achieved [71], the amount of hardware memory used in the resulting hardware memory used [74], and the amount of user memory length used in resulting user memory length used [73].

Of particular interest is the method by which the sample rate and memory length is achieved that must be utilized in the setup and post-processing of the acquisition. The resulting memory decimation factor [63] provides the decimation factor employed on the waveform data as it is written into the hardware memory by the ADC. The post-acquisition upsample factor [64] and the post-acquisition downsample factor [65] contain the determined amount of post-upsampling and downsampling to be employed, typically after compensation of the waveform. The resulting determination of whether it is compensating [67] contains whether the waveform should be digitally compensated.

Also of particular interest is the time interleaved ADC configuration result [59] and vertically interleaved ADC configuration result [60]. The time interleaved ADC configuration result [59] contains the number of digitizers that can be employed to achieve the hardware sample rate and both the time interleaved ADC configuration result [59] and vertically interleaved ADC configuration result [60] affect the resolution possible based on the previously discussed technical discussion. Based on the time interleaved ADC configuration result [59] and vertically interleaved ADC configuration result [60], the system still has several options that can be chosen based on which option provides the highest number of effective bits. Strictly speaking, if the ADCs are time-interleaved according to the time interleaved ADC configuration result [59] and vertically interleaved according to the vertically interleaved ADC configuration result [60], the resolution of the instrument becomes the amount shown in the resulting resolution achieved [61], but the system may optionally choose to average streams of ADC results or even time-interleave and filter results if these provide lower noise and/or higher effective number of bits. These options are available using either a priori knowledge of the system performance (i.e. performance determined during the design and/or manufacture of the instrument) or dynamically based on calibrations that can determine the amount of baseline noise, for example, or effective number of bits in any given acquisition setting. In some examples, whether or not to average multiple ADCs is a setting selected by the oscilloscope and may not be presented on a user interface of the oscilloscope.

Thus, the results provided in the resulting acquisition configuration [30] provide information that can be fed back to the user showing the performance achieved in a given setting. Since the user can alter various performance specifications, for example, those settings shown in the user interface [26] area, the resulting acquisition settings provided in the resulting acquisition configuration [30] area provide settings that can be employed internally and various ADC deployment strategies that can be utilized to lead to trade-offs between sample rate, memory length, bandwidth and resolution and thus enable the deployment of a truly variable resolution oscilloscope.

In some implementations, the settings presented in the resulting acquisition configuration [30] are calculated and presented automatically in response to user interaction with the user interface [26]. For example, with each user modification of a setting in the user interface [26], the preferred resulting acquisition configuration [30] may be selected. As mentioned earlier, an oscilloscope may not present the user interface shown in FIG. 20, but at least some of the settings illustrated in FIG. 20 may be presented throughout various screens of the oscilloscope user interface. Moreover, the oscilloscope may also activate the settings specific to the resulting acquisition configuration [30] upon determining those settings. If the oscilloscope is currently acquiring a signal, it may begin using those settings automatically either immediately or upon the next triggering of the signal. If the oscilloscope is not currently acquiring a signal, it may begin using those settings automatically upon the user instructing the oscilloscope to begin acquiring the next signal. In other words, the oscilloscope may begin using the settings specified by the resulting acquisition configuration [30] without an individual specifying all or most of those settings.

It should be noted that even with all of these deployment possibilities, ERES can be employed on top of all of this still to lead to even higher resolution possibilities, which, because of the tight coupling of the acquisition system settings to the user specification, can provide proper configuration and reporting of resolution improvements.

Figure 21:
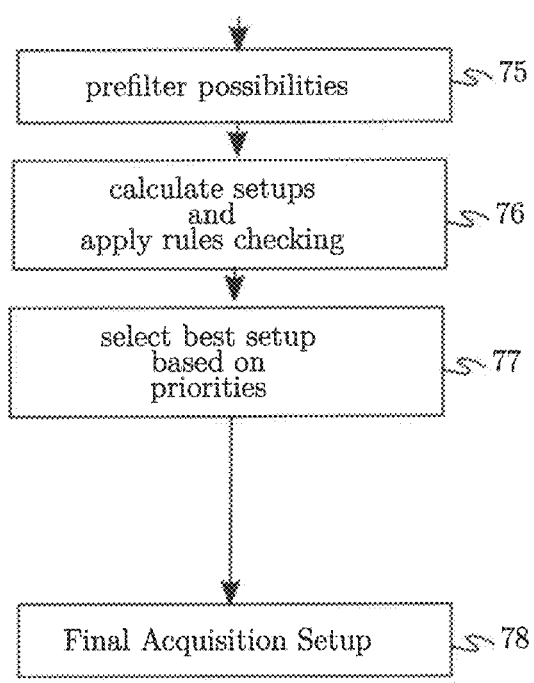
FIG. 21 is a flowchart showing a process for determining an acquisition setup for a variable resolution oscilloscope.
Figure 22:
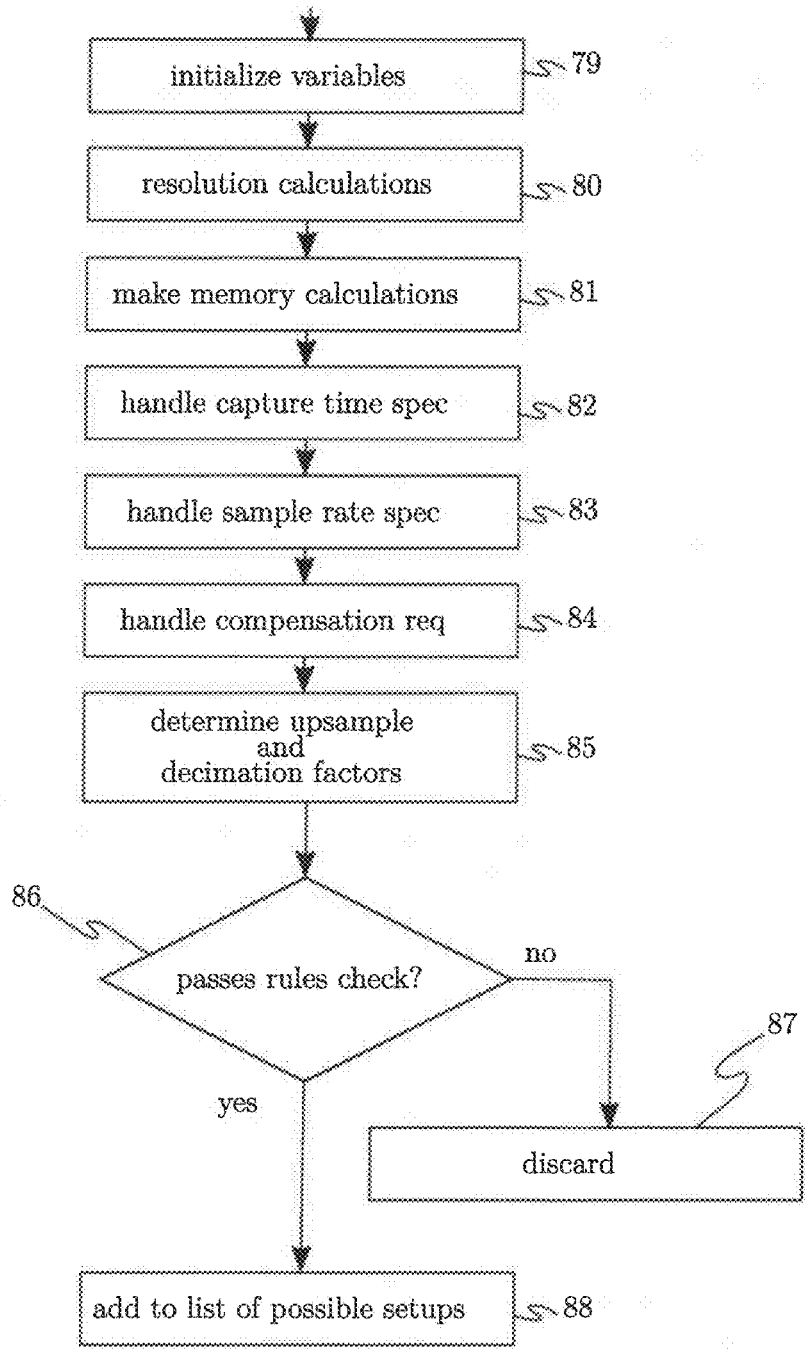
FIG. 22 is a flowchart detailing the calculation of suitable acquisition setups and applying rules checking.

The steps of converting a user interface [26] combined with an internal configuration [27], a model configuration [28], and a priorities configuration 129!into a resulting acquisition configuration [30] usable by the acquisition system is provided in FIG. 21. The calculations are so intertwined that it is preferable to try out various high-level settings and see if these settings work. To reduce the large volume of possibilities, a prefilter process [75] is employed to reduce the possibilities to a manageable level. Then a apply rules checking [76] is employed which calculates acquisition settings for possibilities that survive rules checking. Finally, from the potential plurality of surviving setups, a priority application process [77] is applied that picks the best of the surviving setups based on the priorities configuration [29]. The best setup is the resultant final setup [78] and is used to configure the acquisition system and to provide feedback to the user.

In this process, two groups of variables are passed in: a panel and a model. The panel specifies (1) at least some of the settings that are selected by a user of the oscilloscope using the user interface [26] of FIG. 16, and (2) at least some of the settings that are designated in the internal configuration [27] of FIG. 17 due to user selection of the corresponding resolution mode [34]. The panel contains the following variables in an example:

panel.nc and panel.chFix—the number of channels currently selected by the user and whether those channels are fixed corresponding to a channels configuration [40] and derived from the channel mode setting [33] (e.g., with "Auto" indicating that the number of channels is not fixed);

panel.ch1On and panel.ch2On—whether the user has turned on each of the channels in a channel pair corresponding to a channels on/off setting [32];

panel.comp and panel.compFix—the compensation setting corresponding to a compensation configuration [41] and whether that compensation setting is fixed;

panel.HWSRSpec and panel.HWSRFix—the hardware sample rate specification corresponding to hardware sample rate configuration [43] and whether the hardware sample rate specification is fixed;

panel.bitsSpec and panel.bitsFix—the number of bits specification corresponding to bits configuration [42] and whether the number of bits specification is fixed;

panel.USRSpec and panel.USRFix—the user sample rate specification corresponding to user sample rate configuration [44] and whether the user sample rate specification is fixed;

panel.MustCForHRFix—whether compensation is required for high-resolution modes corresponding to must compensate for HiRes configuration [45];

panel.AIFix—whether upsampling or interpolation is allowed corresponding to allow interpolation configuration [46];

panel.CTSpec and panel.CTFix—the capture time specification corresponding to capture time configuration [37] and whether the capture time specification is fixed;

panel.MLSpec and panel.MLFix—the memory length specification corresponding to memory length configuration [39] and whether the memory length specification is fixed.

Note that the panel variables are partially derived from the user interface [26] but are mostly a set of a priori decisions made about how the oscilloscope will be allowed to operate in any given resolution mode.

The model specifies characteristics of the particular oscilloscope model employed, and contains the variables:

model.HWBW—the hardware bandwidth corresponding to hardware bandwidth configuration [47];

model.MemADC—the amount of memory per each 5 GS/s internal ADC corresponding to memory per ADC configuration [48];

model.MaxADC—the maximum number of 5 GS/s ADCs per channel pair (eight in this implementation).

In the prefilter process [75], in a preferred embodiment, a state-space that is a combination of five variables is explored. These five variable are: (1) mustMCT—whether the capture time specified must be met and is either true or false; (2) comp—whether the system will employ digital compensation and is either true or false; (3) ch—the number of channels within a channel pair and is either one or two; (4) tilv—the number of time-interleaved digitizers of the eight possible per channel pair; and (5) vilv—the number of vertically interleaved digitizers of the eight possible per channel pair.

Before these combinations are explored, two variables based on channel selection are resolved: chFir—whether the number of channels within the channel pair are fixed and nc—the number of channels. These variables are used to resolve the channel selection and channel possibilities. First nc is initialized from panel.nc and chFix is initialized from panel.chFix. Then a variable chOn is calculated to determine the number of channels selected by the user in the channel pair:[1]

[1]The character "$\wedge$" means "and".

$$chOn = \begin{cases} 2 & panel.ch1On \wedge panel.ch2On \\ 1 & \text{otherwise} \end{cases}$$

Then, if nc is equal to 1, then chFi←true because if only one channel is specified, the calculations can proceed as if the scope was placed in two channel mode as in channel mode setting [33]. Finally, nc is equal to 1 and chFix is false and chOn is equal to 1, then we set nc←1 and chFix←true to indicate that the calculations can proceed as if the scope was placed in two channel mode as in channel mode setting [33].

Once these preliminaries are taken care of, the prefilter process [75] loops over all possible combinations of must-MCT, comp, ch, tilv, and vilv. While these combinations are used in a preferred embodiment, other choices can be made for the state-space to explore. For each possible combination of the variables, the following tests are employed:

if panel.compFix$\wedge$(panel.comp$\neq$comp), then the combination is rejected. For example, if the compensation setting is fixed and the selected compensation setting does not meet the value of the compensation variable, reject the combination.

if $\overline{panel.compFix}\wedge\overline{panel.comp}\wedge$comp, then the combination is rejected. For example, if the compensation is not fixed and the compensation setting is not selected and the compensation variable is set to true, then reject the combination.

if tilv·vilv·ch$\neq$model.MaxADC then the combination is rejected. For example, if the number of time interleaved digitizers times the number of vertical interleaved digitizers times the number of channels does not equal the maximum number of ADCs in the oscilloscope model, then reject the combination.

if chFix$\wedge$nc·ch then the combination is rejected. For example, if the number of channels if fixed and the number of channels that are turned on is not the same as the nunber of channels specified by the variable in the combination of variables, then reject the combination.

If a combination of variables survives the prefilter process [75], then it is kept as a possibility to be explored in the next apply rules checking [76], which is shown in detail in FIG. The flowchart in FIG. shows the steps performed for each combination of variables (e.g., mustMCT, comp, ch, tilt, and vilv) that survived the prefilter process [75]. In other words, another loop is performed for each combination of variables that survived the prefilter process (although in some implementations the two loops may be combined into a single loop). First, however, for each combination of variables, a variable initialization step must be performed.

In the initializating variables [79], various variables are initialized: the base resolution br is initialized to 8, the base sample rate bar is initialized to 5 GS/s, the memory decimation factor MDF is initialized to 1. The hardware sample rate is initialized to:

$HWSR \leftarrow bsr \cdot tilv$

In the resolution determination step [80], the resolution is calculated as:

$bits \leftarrow br + \log_2(vilv)$

In the memory calculations step [81], the memory length is calculated as:

$HWMLT \leftarrow model.MemADC \cdot tilv$

It is then restricted further if panel.MLFix to min (HWMLT,panel.MLSpec).

In a capture time handling step [82], the hardware sample rate required to meet the capture time is calculated:

$NFHWSRSpec \leftarrow$ $\begin{cases} \min(panel.HWSRSpec, HWMLT/panel.CTSpec) & \text{if must } MCT \\ panel.HWSRSpec & \text{otherwise} \end{cases}$ In a sample rate handling step [83], the hardware sample rate is refined.

if panel.HWSRFix$\wedge$HWSR<panel.HWSRSpec, the possibility is rejected because of a lack of hardware sample rate.

If panel.HWSRFix, we first calculate a raw memory decimation factor:

$$MDFR \leftarrow HWSR/panel.HWSRSpec$$

Then, we calculate a memory decimation factor MDF as the next higher integer, rounded 12458 sequence of MDFR. A 12458 sequence is 1, 2, 4, 5, 8, 10, 20, 40, 50, 80, 100, 200, 400, 500, 800, etc.

Then, we calculate the hardware sample rate as:

$$HWSR \leftarrow HWSR/MDF$$

And finally we check if HWSR≠panel.HWSRSpec, then the possibility is rejected because the hardware sample rate cannot be achieved.

If panel.HWSRFix then we check if HWSR>NFHWSRSpec. If it is, then we calculate.

$$MDFR \leftarrow HWSR/NFHWSRSpec$$

Then, we calculate a memory decimation factor MDF as the next higher integer, rounded 12458 sequence of MDFR, and:

$$HWSR \leftarrow HWSR/MDF$$

Otherwise, if panel.HWSRFix and HWSR≤NFHWSR-Spec, then we have:

$$MDFR \leftarrow MDF \leftarrow 1$$

In a compensation handling step [84] we determine whether compensation is possible:

$$canComp \leftarrow HWSR \geq model.HWBW \cdot 2.5$$

We generally think of the absolute limit for digital compensation to be generally possible as the sample rate being at least twice the bandwidth. Here we employ a small safety factor of requiring a factor of 2.5. This should not be interpreted in a limiting sense and is simply a choice one can make.

In a upsample and downsample factor calculation step [85], we determine an upsample factor (with a factor less than 1 referring to a decimation). If canComp∧panel.AIFix, then this factor is determined as:

$$factor \leftarrow panel.USRSpec/HWSR$$

Otherwise, if panel. USRSpec<HWSR, then this factor is determined as:

$$factor \leftarrow panel.USRSpec/HWSR$$

Otherwise, the factor←1.

The upsample factor (which could be fractional and even less than one indicating downsampling), is considered to be a rational number. A rational number is a number formed as the ratio of two integers. There are a number of ways to determine the integer numerator and denominator that form a given rational number. One algorithm to compute rational number is described in Chapter 4 of the book 'Concrete Mathematics: A Foundation for Computer Science (2nd Edition) by Ronald L. Graham, Donald E. Knuth, Oren Patashnik'. The algorithm uses the Stern-Brocot tree—an infinite complete binary tree to represent all rational numbers—to compute the rational nunber closest to an input real number. In a upsample and downsample factor calculation step [85], these integers are calculated as puf and pdf representing the post-processing upsample and downsample factors.

if canComp∧panel.AIFix∧(puf>1∨pdf>1) then the memory decimation factor MDF is calculated as the integer, rounded, next higher 12458 sequence of MDFR/factor and puf←1 and pdf←1. In this case, the hardware sample rate is recalculated as:

$$HWSR \leftarrow bsr*tilv/MDF$$

and:

$$canComp \leftarrow HWSR \geq model.HWBW \cdot 2.5$$

and the user sample rate is:

$$USR \leftarrow HWSR$$

Otherwise, the user sample rate is calculated as:

$$USR \leftarrow HWSR \cdot puf/pdf$$

The resulting capture time is calculated as:

$$CT \leftarrow HWMLT/HWSR$$

and the resulting user memory length is calculated as:

$$UML \leftarrow HWMLT*puf/pdf$$

At this point, the acquisition settings have been determined (or are easily derivable) and a rules checking step [86] is applied to make the final determination of the usability of the acquisition settings resulting from a particular combination of variables:

- If panel.CTFix∧(CT<panel.CTSpec) then the combination is discarded in a discard step [87] because of insufficient capture time. For example, the settings may specify that capture time is fixed and may specify a capture time, but the resulting capture time that corresponds to the particular combination of variables may be less than the initially-specified capture time.
- If CT>panel.CTSpec then CT←panel.CTSpec. For example, if the capture time is greater than that specified by the user, the capture time may be limited to that specified by the user.
- If bits>8∧panel.MustCForHRFix∧$\overline{comp}$ then the combination is discarded in a discard step [87] because high resolution operation is not possible without digital compensation. For example, high resolution operation may require more than 8 bits, and a combination of variables may be discarded if the number of bits is greater than 8, the must compensate for HiRes configuration [45] setting is selected, and compensation is not allowed (e.g., at compensation configuration [41]).
- If comp∧$\overline{canComp}$ then the combination is discarded in a discard step [87] because digital compensation is specified and not possible.
- If panel.bitsFix∧panel.bitsSpec≠bits then the combination is discarded in a discard step [87] because of incorrect number of bits of resolution. For example, the settings may have specified that the number of bits is fixed, but the number of bits specified may not equal the number of bits resulting from a particular combination of variables.
- If $\overline{panel.bitsFix}$∧bits>panel.bitsSpec then the combination is discarded in a discard step [87] because of incorrect number of bits of resolution.
- If panel.USRFix∧panel.USRSpec>HWSR∧$\overline{canComp}$ then the combination of variables is discarded in a discard step [87] because it can't compensate. For example, if the settings specify that the user sample rate is fixed, and the specified user sample rate is greater than the hardware sample rate is not allowed, then the combination of variables may be discarded.

If panel.USRFix∧panel.USRSpec>HWSR∧$\overline{\text{panel.AIFix}}$ then the combination of variables is discarded in a discard step [87] because interpolation is not allowed.

If panel.USRFix∧USR≠panel.USRSpec then the combination of variables is discarded in a discard step [87] because the user sample rate that was specified does not equal the sample rate resulting from the combination of variables, and the user sample rate setting was fixed.

If the settings for particular combination of variables survives the rules checking step [86] then those settings are added to a list of possible acquisition setups in a setup accumulation step [88].

The acceptable settings for each setup arising from a combination of variables include:

setup.channels←ch corresponding to resulting channels achieved [58];

setup.tilv←tilv corresponding to time interleaved ADC configuration result [59];

setup.vilv←vilv corresponding to vertically interleaved ADC configuration result [60];

setup.bits←bits corresponding to resulting resolution achieved [61];

setup.HWSampleRate←HWSR corresponding to resulting hardware sample rate achieved [62];

setup.mamDecimationFactor←MDF corresponding to resulting memory decimation factor [63];

setup.canCompensate←canComp corresponding to resulting determination of whether it could compensate [68];

setup.Compensate←comp corresponding to resulting determination of whether it is compensating [67];

setup.puf←puf corresponding to post-acquisition upsample factor [64];

setup.pdf←pdf corresponding to post-acquisition downsample factor [65];

setup.UserSampleRate←USR corresponding to resulting user sample rate achieved [66];

setup.HWMemoryLength←HWMLT corresponding to hardware memory length available result [69];

setup.UserMemoryLength←UML corresponding to user memory length available result [70];

setup.CaptureTime←CT corresponding to resulting capture time achieved [71];

setup.CaptureTimeNeeded←panel.CTSpec corresponding to capture time specified result [72];

setup.UserMemoryLengthUsed←(CT·USR) corresponding to resulting user memory length used [73];

setup.HWMemoryLengthUsed←(CT·HWSR) corresponding to resulting hardware memory used [74];

setup.Favorite←true.

As mentioned previously, result of the processing of many possible combinations of variables will result in either no, one, or many acquisition setups that meet the criteria. In the case in which there are many acquisition setups that meet the relevant criteria, one must be chosen in a priority application process [77].

The priorities provided in a priorities configuration [29] show a set of priorities. Note that each of the setups that survived the rules checking has a variable aetup.Favorite=true.

A first priority [49] is examined, and in this particular case it is channels. Every setup is examined to find the maximum value of setup.channels. Then each setup is examined again and if the value of setup.channels does not equal the max value, then setup.Favorite←false. In other words, the setup with the maximum number of channels is selected, unless there are multiple setups with that maximum number of channels. In that case, all other setups are discarded and the next priority is applied to the surviving setups.

Next, a second priority [50] is examined, and in this particular case it is compensation. Every setup is examined to find the maximum value of setup.Compensate (in this case the maximum value being "True" such that compensation is allowed). Then each setup is examined again and if the value of setup.Compensate for a particular setup does not equal the max value, then setup.Favorite←false. In other words, assuming that at least one setup allowed compensation, all the setups that do not allow compensation are discarded.

This process continues for each of a third priority [51], fourth priority [52], fifth priority [53], sixth priority [54], and finally a last priority [55]. Of course a designer might add to these priorities and these are only those used in a preferred embodiment.

For a priority of HiRes, the selection finds the maximum of min (setup.bits, 9). In this case, all setups in which the number of bits equals 9 or greater survives because those setups are high resolution. This selection may not necessarily select the setup with the highest resolution, but simply discards those with lower resolutions.

For a priority of user sr, the selection finds the maximum of setup. UserSampleRate. The system then loops through all user sample rates for the various setups and discards any setups that do not have the maximum user sample rate.

For a priority of capture time, the selection process finds the maximum of min (setup.CaptureTimeNeeded, setup.CaptureTime). The system then discards all setups that have a lower maximum value.

For a priority of bits, the selection process finds the maximum number of bits. The system then loops through all setups and discards the setups that do not have that maximum number of bits.

For a priority of hardware sr the selection process finds the maximum of setup.HWSampleRate and then loops through all setups and discards the setups that do not have the maximum hardware sample rate.

The selection stops when there is only one setup with its setup.Favorite=true. The index of this setup is shown in the resulting possibilities [56]. If there are still multiple setups at the end, one may be arbitrarily chosen due to the multiple remaining setups satisfying the relevant constraints.

In some implementations, a user of an oscilloscope may be able to select between multiple setups that survive the selection process. In some implementations, the prioritization process may involve scoring each of the setups based on the priorities (e.g., with each priority providing a portion of the score for each setup). The resulting scores may be used in the selection process and users may be able to view the resulting scores. As such, users may be able to toggle from one setup to the next, and may apply any such setup to the oscilloscope, although the preferred setup may be applied automatically without a user selecting each individual setting, as described previously in this disclosure.

As an important note, it should be understood that once the final acquisition setup has been chosen, or even during selection, a given setup will have given values of vilv and tilv that contains the vertical- and time-interleaving configuration to be employed. The oscilloscope software may have a priori knowledge due to design time or manufacture time information, or can measure dynamically, the effectiveness of various configurations in increasing bits of resolution. For example, it might be known that averaging streams of data or sampling at a higher rate and filtering results in higher ENOB. In these cases, it may be advantageous to manipulate vilv and tilv to produce the most advantageous performance as requested by the user operating the oscilloscope.

Figure 23:
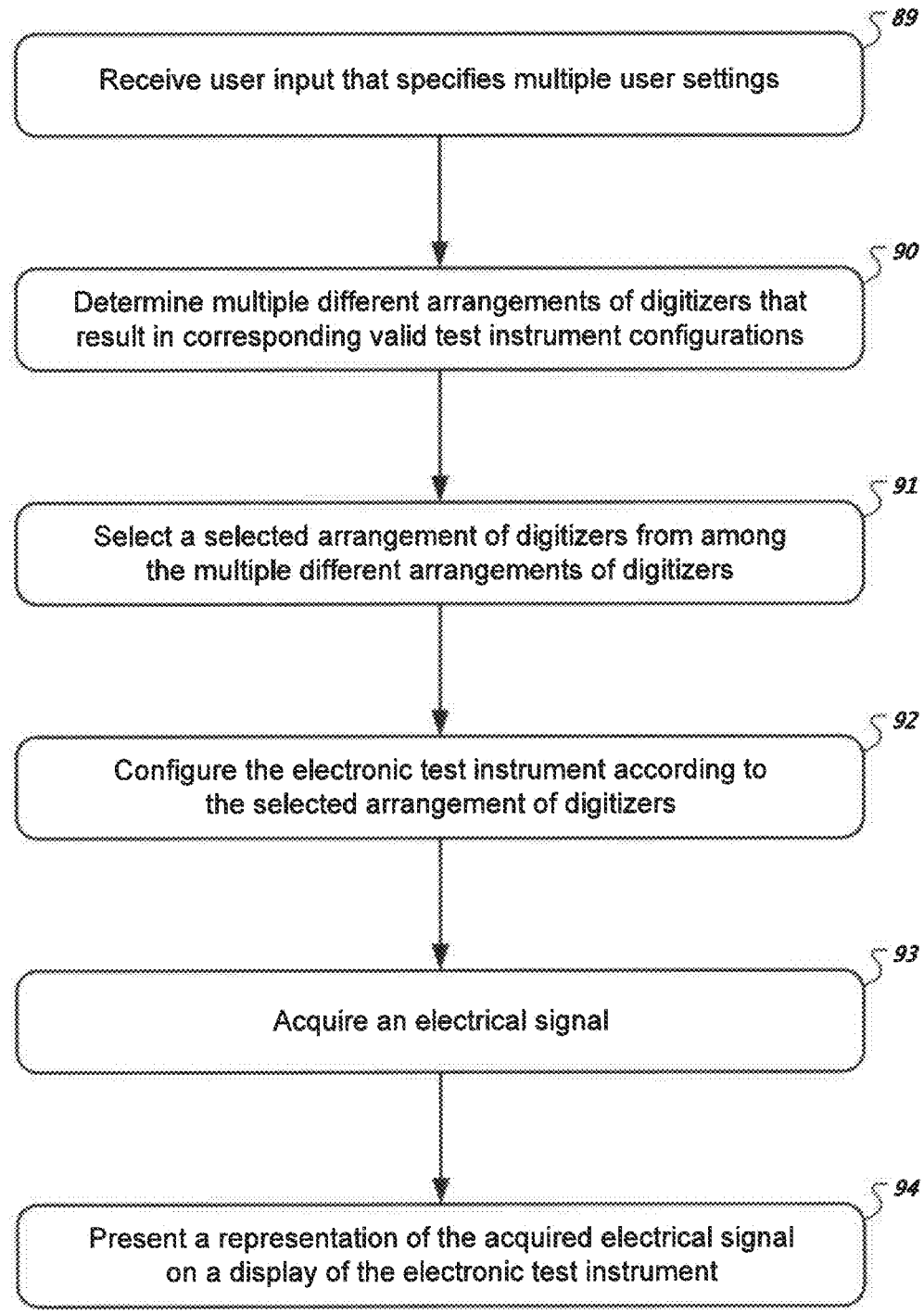
FIG. 23 is another flowchart showing a process for determining an acquisition setup for a variable resolution oscilloscope.

FIG. 23 is another flowchart showing a process for determining an acquisition setup for a variable resolution oscilloscope.

At box 89, the electronic test instrument (e.g., a variable resolution oscilloscope) receives user input that specifies multiple settings. An example user setting includes whether each channel is on or off. Another example user setting includes a time base that indicates the time per division on the display. Another example user setting includes a selected resolution mode. The user input can include user input that interacts with user interface [26], and therefore can include user selection of at least some of the interface elements illustrated in that user interface, as described in additional detail throughout this disclosure.

The user input can include selection of one of the resolution mode [34] settings. User selection of one of these settings can select a corresponding group of test-instrument settings, which are illustrated by the internal configuration [27]. As described in greater detail throughout this disclosure, at least some of the settings illustrated in the internal configuration [27] represents settings that are specified based on the selected resolution mode, and the values for at least some of the test-instrument settings change based on which resolution mode is selected. In some implementations, one or more of the test-instrument settings are not modifiable by a user of the oscilloscope (at least in some permission modes) other than through selection of a resolution mode [34]. Accordingly, selection of the resolution mode [34] may select a group of test-instrument settings without a user individually selecting those settings one at a time, even if the test-instrument settings are separately modifiable by a user.

At box 90, the electronic test instrument determines multiple different arrangements of digitizers that result in corresponding valid test instrument configurations. (e.g., resulting acquisition configuration [30]). In fact, the arrangement of digitizers may only be some of multiple variables that can be varied to identify valid test instrument configurations. As described previously in this disclosure, the multiple variables can include at least: (1) mustMCT—whether the capture time specified must be met and is either true or false; (2) comp—whether the system will employ digital compensation and is either true or false; (3) ch—the number of channels within a channel pair and is either one or two; (4) tilv—the number of time-interleaved digitizers of the eight possible per channel pair; and (5) vilv—the number of vertically interleaved digitizers of the eight possible per channel pair.

Determining the multiple different arrangements can involve identifying at least some (e.g., maybe all) different combinations of the variables (e.g., based on different values for the variables), and then applying multiple rules to determine whether a valid test instrument configuration results from the combination of variables. Doing so can involve applying the prefilter process [75] loop described above, and the calculate setups and apply rules checking [76] loop described above, although these loops may be combined into a single loop in some implementations.

These loops and the rules applied therein enables the electronic test instrument to discard those combinations of variables that do not result in a valid test instrument configuration, for example, because the combination of variables is not possible due to physical constraints of the device or because the combination of variables violates preferences specified in the user interface [26], the internal configuration [27], and the model configuration [28].

The rules can account for not only the variables such as the respective arrangement of digitizers, but also the user-specified settings in the user interface [26], the internal configuration [27], the model configuration [28], and values that are derived therefrom, such as those illustrated herein with respect to the discussion of initializing variables [79].

At box 91, in the circumstance in which multiple arrangements of digitizers/variables result in valid test instrument configurations, the electronic test instrument may select a particular arrangement of digitizers/variables based on predefined priorities. Applying priorities configuration [29] can include selecting the arrangement of digitizers/variables that results in the optimal value among the options, with the priority of the specifications being specified by the priorities configuration [29]. These priorities include selecting the arrangements that use the greatest number of channels (and therefore discarding those that use fewer channels) and selecting arrangements that use the greatest user sample rate (and discarding those that use lower user sample rates).

At box 92, the electronic test instrument configures its settings in accordance with the selected arrangement of digitizers/variables. For example, after an arrangement of digitizers/variables has been selected (in some cases without user input after user interaction with any of the interface elements in user interface [26]), the electronic test instrument may, while acquiring a signal, apply the settings specified by the resulting acquisition configuration [30] immediately or upon the next time that the electronic test instrument arms its trigger. If the electronic test instrument is not currently acquiring a signal, the settings may be stored, such that upon the next user input that instructs the electronic test instrument to acquire a signal, the electronic test instrument arms its trigger using the resulting acquisition configuration [30]. This arming of the trigger and acquisition of the signal may occur with at least some of the settings in the resulting acquisition configuration [30] changing without a user specifying at least some of the changes.

At box 93, the electronic test instrument acquires an electrical signal. For example, the electronic test instrument may receive an electrical signal through leads connected to channel inputs, and may process and store a digital representation of the electrical signal in accordance with the resulting acquisition configuration [30].

At box 94, the electronic test instrument presents a representation of the acquired electrical signal on a display of the electronic test instrument. For example, the electronic test instrument may display a representation of the waveform in a time-base representation with a time horizontal axis and a voltage vertical axis, or may display an eye-diagram representation of the acquired electrical signal.

Thus, an efficient method for configuring and operating a variable resolution oscilloscope in many possible modes have been presented.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A computer-implemented method, comprising:
receiving, by an electronic test instrument that includes a plurality of digitizers, user input that specifies user-configurable settings of the electronic test instrument;
identifying, by the electronic test instrument, hardware characteristics of the electronic test instrument;
determining, by the electronic test instrument, multiple different arrangements of the plurality of digitizers that result in valid configurations of the electronic test instrument accounting for when the electronic test instrument is configured according to the user-configurable settings specified by the user input and has the hardware characteristics of the electronic test instrument, wherein:
  (i) a first arrangement of digitizers from the multiple different arrangements of the plurality of digitizers specifies a first number of digitizers interleaved horizontally and a second number of digitizers interleaved vertically,
  (ii) a second arrangement of digitizers from the multiple different arrangements of the plurality of digitizers specifies a third number of digitizers interleaved horizontally and a fourth number of digitizers interleaved vertically, and
  (iii) the first arrangement of digitizers is different from the second arrangement of digitizers, with the first number of digitizers interleaved horizontally being different from the third number of digitizers interleaved horizontally or the second number of digitizers interleaved vertically being different from the fourth number of digitizers interleaved vertically;
selecting, by the electronic test instrument, the first arrangement of digitizers from among the multiple different arrangements of the plurality of digitizers that result in valid configurations of the electronic test instrument;
acquiring, by the electronic test instrument as a result of the electronic test instrument selecting the first arrangement of digitizers from among the multiple different arrangements of the plurality of digitizers, an electrical signal with the plurality of digitizers of the electronic test instrument being configured according to the first arrangement of digitizers; and
presenting, by the electronic test instrument, a representation of the acquired electrical signal on a display of the electronic test instrument.

2. The computer-implemented method of claim 1, wherein the first arrangement of digitizers is different from the second arrangement of digitizers, with the first number of digitizers interleaved horizontally being different from the third number of digitizers interleaved horizontally and the second number of digitizers interleaved vertically being different from the fourth number of digitizers interleaved vertically.

3. The computer-implemented method of claim 1, wherein the user-configurable settings of the electronic test instrument specified by the user input include:
a time base setting of the electronic test instrument; and
an on or off setting of each channel of multiple channels of the electronic test instrument.

4. The computer-implemented method of claim 1, wherein the hardware characteristics of the electronic test instrument accounted for in determining the multiple different arrangements of the plurality of digitizers that result in valid configurations include memory per digitizer.

5. The computer-implemented method of claim 4, wherein the hardware characteristics of the electronic test instrument accounted for in determining the multiple different arrangements of the plurality of digitizers that result in valid configurations include hardware bandwidth.

6. The computer-implemented method of claim 1, wherein selecting the first arrangement of digitizers from among the multiple different arrangements of the plurality of digitizers is performed by the electronic test instrument without user input selecting the first arrangement of digitizers from among the multiple different arrangements of digitizers.

7. The computer-implemented method of claim 1, wherein determining the multiple different arrangements of the plurality of digitizers that result in valid configurations of the electronic test instrument is performed by the electronic test instrument without user input that specifies an arrangement of the plurality of digitizers.

8. The computer-implemented method of claim 1, wherein:
the valid configuration of the electronic test instrument that results from the first arrangement of digitizers is different from a valid configuration of the electronic test instrument that results from the second arrangement of digitizers; and
selecting the first arrangement of digitizers from among the multiple different arrangements of the plurality of digitizers includes analyzing the valid configurations of the electronic test instrument that result from the multiple different arrangements of the plurality of digitizers, based on rules that prioritize certain electronic test instrument configuration settings over other settings of electronic test instrument configuration settings.

9. The computer-implemented method of claim 1, wherein:
the first number of digitizers interleaved horizontally includes multiple digitizers interleaved horizontally;
the second number of digitizers interleaved vertically includes multiple digitizers interleaved vertically;
the third number of digitizers interleaved horizontally includes multiple digitizers interleaved horizontally; and
the fourth number of digitizers interleaved vertically includes multiple digitizers interleaved vertically.

10. An electronic test instrument, comprising:
a display;
a plurality of digitizers;
multiple acquisition channels;
one or more processors;
one or more computer-readable devices including instructions that, when executed by the one or more processors, cause the electronic test instrument to perform operations that include:
  receiving, by the electronic test instrument, user input that specifies user-configurable settings of the electronic test instrument;
  identifying, by the electronic test instrument, hardware characteristics of the electronic test instrument;
  determining, by the electronic test instrument, multiple different arrangements of the plurality of digitizers that result in valid configurations of the electronic test instrument accounting for when the electronic test instrument is configured according to the user-configurable settings specified by the user input and has the hardware characteristics of the electronic test instrument, wherein:
- (i) a first arrangement of digitizers from the multiple different arrangements of the plurality of digitizers specifies a first number of digitizers interleaved horizontally and a second number of digitizers interleaved vertically,
- (ii) a second arrangement of digitizers from the multiple different arrangements of the plurality of digitizers specifies a third number of digitizers interleaved horizontally and a fourth number of digitizers interleaved vertically, and
- (iii) the first arrangement of digitizers is different from the second arrangement of digitizers, with the first number of digitizers interleaved horizontally being different from the third number of digitizers interleaved horizontally or the second number of digitizers interleaved vertically being different from the fourth number of digitizers interleaved vertically;

selecting, by the electronic test instrument, the first arrangement of digitizers from among the multiple different arrangements of the plurality of digitizers that result in valid configurations of the electronic test instrument;

acquiring, by the electronic test instrument as a result of the electronic test instrument selecting the first arrangement of digitizers from among the multiple different arrangements of the plurality of digitizers, an electrical signal with the plurality of digitizers of the electronic test instrument being configured according to the first arrangement of digitizers; and presenting, by the electronic test instrument, a representation of the acquired electrical signal on the display of the electronic test instrument.

11. The electronic test instrument of claim 10, wherein the first arrangement of digitizers is different from the second arrangement of digitizers, with the first number of digitizers interleaved horizontally being different from the third number of digitizers interleaved horizontally and the second number of digitizers interleaved vertically being different from the fourth number of digitizers interleaved vertically.

12. The electronic test instrument of claim 10, wherein the user-configurable settings of the electronic test instrument specified by the user input include:
a time base setting of the electronic test instrument; and
an on or off setting of each acquisition channel of the multiple acquisition channels of the electronic test instrument.

13. The electronic test instrument of claim 10, wherein the hardware characteristics of the electronic test instrument accounted for in determining the multiple different arrangements of the plurality of digitizers that result in valid configurations include memory per digitizer.

14. The electronic test instrument of claim 13, wherein the hardware characteristics of the electronic test instrument accounted for in determining the multiple different arrangements of the plurality of digitizers that result in valid configurations include hardware bandwidth.

15. The electronic test instrument of claim 10, wherein selecting the first arrangement of digitizers from among the multiple different arrangements of the plurality of digitizers is performed by the electronic test instrument without user input selecting the first arrangement of digitizers from among the multiple different arrangements of digitizers.

16. The electronic test instrument of claim 10, wherein determining the multiple different arrangements of the plurality of digitizers that result in valid configurations of the electronic test instrument is performed by the electronic test instrument without user input that specifies an arrangement of the plurality of digitizers.

17. The electronic test instrument of claim 10, wherein:
the valid configuration of the electronic test instrument that results from the first arrangement of digitizers is different from a valid configuration of the electronic test instrument that results from the second arrangement of digitizers; and selecting the first arrangement of digitizers from among the multiple different arrangements of the plurality of digitizers includes analyzing the valid configurations of the electronic test instrument that result from the multiple different arrangements of the plurality of digitizers, based on rules that prioritize certain electronic test instrument configuration settings over other settings of electronic test instrument configuration settings.

18. The electronic test instrument of claim 10, wherein:
the first number of digitizers interleaved horizontally includes multiple digitizers interleaved horizontally;

the second number of digitizers interleaved vertically includes multiple digitizers interleaved vertically;

the third number of digitizers interleaved horizontally includes multiple digitizers interleaved horizontally; and the fourth number of digitizers interleaved vertically includes multiple digitizers interleaved vertically.

* * * * *